(12) United States Patent
Przydatek et al.

(10) Patent No.: US 7,962,298 B2
(45) Date of Patent: Jun. 14, 2011

(54) REVENUE CLASS POWER METER WITH FREQUENCY REJECTION

(75) Inventors: Piotr B. Przydatek, Victoria (CA); Michael D. Bandsmer, Victoria (CA); Erin C. McPhalen, Victoria (CA); Daniel N. Loewen, Sidney (CA); Darrin G. Marr, Victoria (CA); Robert M. Law, Duncan (CA)

(73) Assignee: Power Measurement Ltd., Saanichton, British Columbia (CA)

( * ) Notice: Subject to any disclaimer, the term of this patent is extended or adjusted under 35 U.S.C. 154(b) by 1338 days.

(21) Appl. No.: 11/504,269

(22) Filed: Aug. 15, 2006

(65) Prior Publication Data
US 2007/0067121 A1    Mar. 22, 2007

Related U.S. Application Data

(63) Continuation-in-part of application No. 11/444,031, filed on May 31, 2006, now abandoned.

(60) Provisional application No. 60/717,688, filed on Sep. 16, 2005.

(51) Int. Cl.
*G06F 19/00* (2011.01)
(52) U.S. Cl. ......................................................... 702/61
(58) Field of Classification Search ................... 702/61, 702/64, 182–185
See application file for complete search history.

(56) References Cited

U.S. PATENT DOCUMENTS

| | | | |
|---|---|---|---|
| 3,641,531 A | 2/1972 | Heartz | 340/184 |
| 5,317,250 A | 5/1994 | Warmerdam | 324/156 |
| 6,000,034 A | 12/1999 | Lightbody et al. | 713/202 |
| 6,008,635 A * | 12/1999 | Haefele et al. | 324/142 |
| 6,016,432 A | 1/2000 | Stein | 455/557 |
| 6,614,219 B2 | 9/2003 | Dadian | 324/142 |
| 6,615,147 B1 | 9/2003 | Jonker et al. | |
| 6,792,364 B2 | 9/2004 | Jonker et al. | |
| 6,871,150 B2 | 3/2005 | Huber et al. | 702/62 |
| 7,191,076 B2 | 3/2007 | Huber et al. | 702/62 |
| 2007/0008171 A1 | 1/2007 | Bowman | 340/870.02 |

(Continued)

OTHER PUBLICATIONS

Alpha Zähler, High Precision Rack Mounted Meter, alpha A2500, Elster Messtechnik GmbH, 2 pgs., published on or after Apr. 7, 2003.

(Continued)

*Primary Examiner* — Edward Raymond
(74) *Attorney, Agent, or Firm* — Brinks Hofer Gilson & Lione

(57) ABSTRACT

A power meter for measuring power parameters on one or more electrical power lines/loads is configured to include a revenue class metering module and a power quality metering module. The revenue class metering module and the power quality metering module may use the same measured voltage and current signals to generate revenue accurate power consumption information and power quality information, respectively. The power meter may also include a plurality of filters configured to attenuate high frequency signals included in the voltage and current signals. Each of the filters may be configured with a corner frequency, gain and signal propagation delay that is substantially equal. The filtered current and voltage signals may be received and processed by the revenue class metering module, and the power quality metering module to generate revenue accurate power consumption information and power quality information, respectively. Alternatively, the filtered current and voltage signals may be received and processed by the power quality metering module to generate power quality information, and unfiltered current and voltage signals may be received and processed by the revenue class metering module to generate revenue accurate power consumption information.

45 Claims, 9 Drawing Sheets

U.S. PATENT DOCUMENTS

2007/0067119 A1  3/2007  Loewen et al. ............... 702/57

OTHER PUBLICATIONS

CewePrometer, Product Guide, CEWE Instrument, 12 pgs., published on or after Oct. 22, 2004.
Iskraemeco, Energy Measurement and Management, TE340, DE340 Product Guide, 4 pgs., published on or after Dec. 14, 1999.
Enermet OY, Class 0.2S and 0.5S High Precision Meters Q402/405, 2 pgs., published on or after Apr. 28, 2003.
International Standard 61000-4-30, Electromagnetic compatibility (EMC)—Part 4-30: Testing and measurement techniques—Power quality measurements methods; Second Ed., Commission Electrotechnique Internationale, International Electrotechnical Commission, Geneva, Switzerland, Feb. 2003; 47 pgs. [Note: The complete document is 92 pages, however, only the pages in English (odd numbered pages) are submitted, the even numbered pages are in French, and are not submitted herewith.].
International Standard IEC62053-22, Electricity Metering Equipment (AC)—Particular Requirements—Part 22: Static meters for active energy (classes 0,2 S and 0,5 S), Second Ed., 33 pgs., Commission Electrotechnique Internationale, International Electrotechnical Commission, Geneva, Switzerland, Jan. 2003; [Note: The complete document is 33 pages, however, only the pages in English (odd numbered pages) are submitted, the even numbered pages are in French, and are not submitted herewith.].
International Standard IEC62053-22, Electricity Metering Equipment (AC)—Particular Requirements—Part 22: Static meters for active energy (classes 0,2 S and 0,5 S), First Ed., 33 pgs., Commission Electrotechnique Internationale, International Electrotechnical Commission, Geneva, Switzerland, Jan. 2003.
Encore Series, 61000 System Manual/Specification, The Intelligent Instrument, 4 pgs., Dranetz BMI, Edison, NJ © 2005 Dranetz-BMI.
Einschubzähler mit statischem Meßwerk, DIN 43862, ICS 17.220.20, 4 pgs., Seite 2 bis 4, Ersatz Für Ausgabe Jul. 1983; Deutsche Elektrotechnische Kommission im DIN and VDE (DKE).
Power Logic® Series 4000 Circuit Monitors, Document # 3020H00601, 4 pgs., Jan. 2006; © 2006 Schneider Electric.
International Standard 61000-4-30, Electromagnetic compatibility (EMC)—Part 4-30: Testing and measurement techniques—Power quality measurements methods; First Ed., 90 pgs., Commission Electrotechnique Internationale, International Electrotechnical Commission, Geneva, Switzerland, Feb. 2003.
International Standard IEC60529, Degrees of Protection Provided by Enclosures (IP code), Commission Electrotechnique Internationale, International Electrotechnical Commission, 96 pgs., Geneva, Switzerland, Feb. 2001.
International Standard IEC1107, Data Exchange for Meter Reading, Tariff and Load Control—Direct Local Data Exchange, Commission Electrotechnique Internationale, International Electrotechnical Commission, 122 pgs., Geneva, Switzerland, Mar. 1996.
Quantum ® Q1000, Electronic Multimeasurement Meter, 4 pgs., Schlumberger, Jan. 2001.
International Standard IEC62052-11, Electricity Metering Equipment (AC)—General Requirements—Part 11: Electricity metering equipment (AC)—General requirements, tests and test conditions,—First Ed., 92 pgs., Commission Electrotechnique Internationale, International Electrotechnical Commission, Geneva, Switzerland, Feb. 2003.
ION® 8600 User Guide, Power Measurement, 219 pgs., Jun. 2005.
Linear Technology, LTC1563-2/LTC1563-3, Active RC, E Order Lowpass Filter Family, 20 pgs, Dec. 5, 2005.
ANSI C12.18-1996, Protocol Specification for ANSI Type 2 Optical Port, 39 pgs., National Electrical Manufacturers Association, Apr. 8, 1996.
American National Standard, ANSI C12.20-2002 (revision of ANSI C12.20-1998), For Electricity Meter—0.2 and 0.5 Accuracy Classes, National Electrical Manufacturers Association @ 2003.

* cited by examiner

REVENUE CLASS POWER METER WITH FREQUENCY REJECTION

RELATED APPLICATIONS

The present patent document claims the benefit of the filing date under 35 U.S.C. §119(e) of Provisional U.S. patent application Ser. No. 60/717,688, filed Sep. 16, 2005, which is hereby incorporated by reference. In addition, the present application is a continuation-in-part of U.S. patent application Ser. No. 11/444,031, filed May 31, 2006 now abandoned, which is hereby incorporated by reference.

BACKGROUND

1. Field of the Invention

The present invention relates to power metering, and more particularly to a revenue class power meter also operable as a power quality meter due to frequency rejection capability of the revenue class power meter.

2. Background and Relevant Art

Power metering technology is evolving towards multi-functional metering systems. Power meters provide feedback for voltage, current, and power in one or more power lines. Meters also may be configured to provide control functions for a load connected to a power line. Commonly, a meter may be configured for revenue metering, including circuitry and features that allow monitoring of energy usage for the purposes of determining energy costs. Alternatively, a meter may be configured to provide power quality metering, including precisely calibrated circuitry to accurately determine dynamics of the power flowing on one or more power lines. Power meters may include communications features that allow bi-directional communication with the meter. The communication features allow the meter to communicate with other devices such as a computer, other meters, control panels and the like. The communications features may communicate over an open network using a communication protocol.

Power meters used for revenue metering are described as a revenue class meter. A revenue class meter is a meter that includes hardware and software that complies with the operational requirements, measurement accuracy, calculation accuracy, and data logging requirements of revenue class metering standards International Electrotechnical Commission (IEC) 62052-11 and IEC 62052-22. In addition, a revenue class meter must be calibrated, certified, and sealed as being in the revenue class. Power meters capable of measuring with revenue accuracy, but that are not otherwise compliant with metering standards IEC 62052-11 and IEC 62052-22, are known as revenue accurate meters. Revenue accurate meters do not include software and/or hardware required of revenue quality meters, and thus cannot be, certified and sealed as a revenue class meter.

Power quality power meters, on the other hand, are meters capable of accurately measuring, capturing and logging transients and other events for purposes of analysis, system reliability, and correction/maintenance. Power quality meters include hardware and software capable of measuring such transients and other events that are significantly different from that of a revenue class meter. Because of the significantly different hardware and software, revenue class meters are unable to perform as power quality meters, and power quality meters are unable to perform as revenue class meters.

BRIEF SUMMARY OF THE INVENTION

The present invention includes a revenue class power meter capable of operation as both a revenue class meter and a power quality meter. The revenue class power meter includes revenue class metering module that is operable to generate revenue accurate power consumption information based on measured power parameter signals. The revenue class power meter also includes a power quality metering module operable to generate power quality information based on the same measured power parameter signals.

The revenue class power meter also includes a plurality of low pass integrated filters. The filters may be configured to provide high frequency rejection of signal components included in the measured power parameter signals. The filtered voltage and current signals may be provided to the revenue class metering module and/or the power quality metering module. In order to maintain accuracy of the revenue accurate power consumption information generated with the revenue class metering module, the phase shift of the power parameter signal, may be maintained substantially the same in each of the filters. The filters may each be configured with substantially the same corner frequency, gain and signal propagation delay to maintain substantially the same non-linear constant phase shift. In addition, the filters may be operated with a common clock signal to maintain substantially the same non-linear constant phase shift.

An interesting feature of the revenue class power meter relates to the filters. In one example, the filters may include analog filters and digital filters configured in series to cooperatively operate to attenuate high frequency signal components from the power parameter signals. The analog filters may first attenuate a plurality of the high frequency signal components, and the digital filters may attenuate the remaining high frequency signal components. Accordingly, high frequency rejection may be performed in both the time domain using the analog filters and in the frequency domain using the digital filters.

Another interesting feature of the revenue class power meter relates to the configuration of the revenue class metering module and the power quality metering module. In one example configuration, both the revenue class metering module and the power quality metering module may receive the filtered measured power parameter signals. In another example configuration, the revenue class metering module may receive unfiltered measured power parameters, and the power quality metering module may receive the same measured power parameters that have been filtered.

The foregoing summary is provided only by way of introduction. The features and advantages of the power meter having a revenue class metering module and a power quality metering module may be realized and obtained by means of the instrumentalities and combinations particularly pointed out in the claims. Nothing in this section should be taken as a limitation on the claims, which define the scope of the invention. Additional features and advantages of the present invention will be set forth in the description that follows, and in part will be obvious from the description, or may be learned by practice of the present invention.

DETAILED DESCRIPTION OF THE EMBODIMENTS

Figure 1:
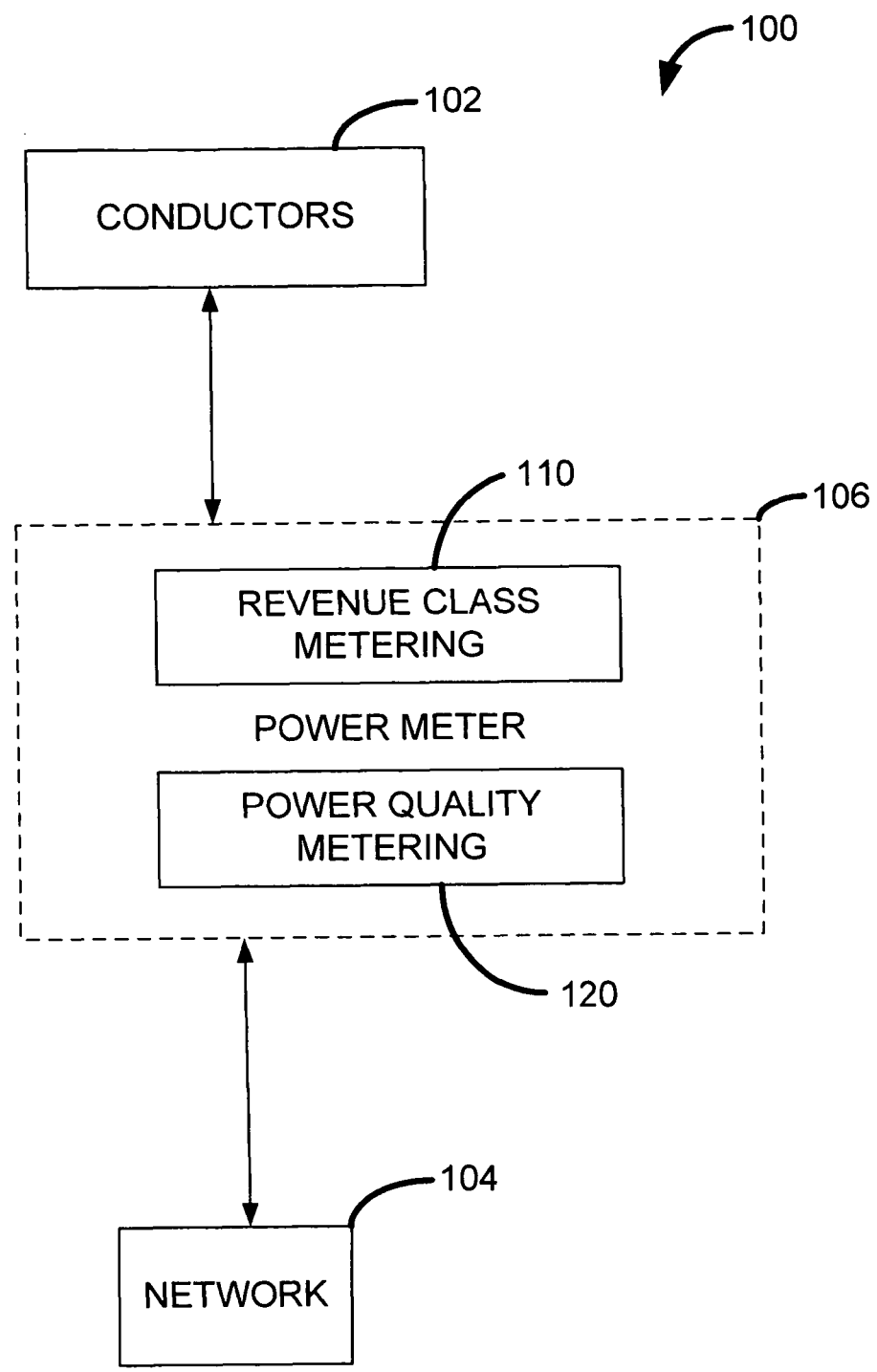
FIG. 1 is a block diagram of an example of a power system that includes a power meter.

FIG. 1 illustrates a block diagram representation of an example of a portion of a power distribution system 100. The power distribution system 100 includes a plurality of conductors 102, a network 104 and at least one revenue class power meter 106. The conductors 102 and the network 104 may be coupled with the power meter 106 as illustrated. Herein, the phrase "coupled with" or "coupled to" is defined to mean directly connected to, or indirectly connected through one or more intermediate components. Such intermediate components may include both hardware and software based components. Further, to clarify the phrases "at least one of <A>, <B>, . . . and <N>" or "at least one of <A>, <B>, . . . <N> or combinations thereof" are defined by the Applicant in the broadest sense, superseding any other implied definitions herebefore or hereinafter unless expressly asserted by the Applicant to the contrary, to mean one or more elements selected from the group comprising A, B, . . . and N, that is to say, any combination of one or more elements A, B, . . . or N including any one element alone or in combination with one or more of the other elements which may include, in combination, additional elements not listed.

The conductors 102 are operable to allow the flow of electrical energy therethrough. The conductors 102 may be power cables, high tension lines, bus duct, bus bar, substation terminals, generator terminals, circuit breaker terminals, and/or any other mechanism, device, or materials capable of conducting current and voltage. The conductors 102 may be part of a two-wire, three-wire, and/or four-wire power system. The power meter 106 may be configured to meter single-phase or multi-phase power systems and loads, or combinations thereof via the conductors 102.

The network 104 may be the Internet, a public or private intranet, an extranet, a public telephone system, a wireless communication system or any other network configuration to enable transfer of data and commands. An example network configuration involves a wireless communication device communicating with a base station, which is in communication with a public switched telephone network (PSTN), however, other wired and/or wireless communication networks are contemplated. Communications may also include IP tunneling protocols such as those that allow virtual private networks coupling multiple intranets or extranets together via the Internet. The network 104 may support application protocols, such as, for example, telnet, POP3, Mime, HTTP, HTTPS, PPP, TCP/IP, SMTP, proprietary protocols, or any other network protocols known in the art. During operation, the power meter 106 may communicate using the network 104 to transmit and receive data, such as measurement related data, commands, and any other information.

The power meter 106 may be a programmable logic controller (PLC), a remote terminal unit (RTU), an electronic power meter, a protective relay, a fault recorder or other similar intelligent device installed in the field and capable of monitoring electrical energy of at least one of the conductors 102. In addition, the power meter 106 may perform other functions such as, for example, power distribution system protection, management of power generation, management of energy distribution, and management of energy consumption.

The power meter 106 may include sensors to monitor the electrical energy flowing within the conductors 102. The power meter 106 may process the sensed electrical energy to derive, store, and display data for various electrical parameters indicative of the electrical energy flowing in the conductors 102. For example, the power meter 106 may provide measurement of voltage and current to determine active, reactive, and/or apparent energy over a range of frequencies, or combinations thereof. The power meter 106 may also provide outputs to, and receive inputs from, the power distribution system 100 and/or the network 106. As such, the power meter 106 may be configured to measure, log, and perform calculations related to the voltage and current on the conductors 102.

The power meter 106 includes a revenue class metering module 110 and a power quality metering module 120. The revenue class metering module 110 and the power quality metering module 120 may use the same measured voltage and current values to provide revenue class metering functionality and power quality metering functionality, respectively. Examples of a power quality meter integrated with a revenue meter are described in U.S. Pat. No. 6,615,147, for a REVENUE METER WITH POWER QUALITY FEATURES, issued on Sep. 2, 2003, and U.S. Pat. No. 6,792,364, for a REVENUE METER WITH POWER QUALITY FEATURES, issued on Sep. 14, 2004, both of which are incorporated by reference in their entirety herein.

The revenue class metering module 110 may provide tariff metering functionality, such as kilowatt hour (KWH) and kilovar hour (KVAR) consumption, or any other functionality related to measurement and calculation of power consumption for revenue billing purposes. The revenue class metering module may generate revenue accurate power consumption information base on the received voltage and current values. Such tariff metering may occur in a determined frequency range of about 16 Hz to about 400 Hz. The revenue class metering module 110 may be configured to meet the IEC 62053-22 and/or ANSI C12.20 standard for revenue metering.

The power quality metering module 120 may provide detection logging and analysis of voltage and current harmonics, voltage and current inter-harmonics, voltage and current anomalies, such as sag/swell(s) or transient(s), and/or any other power quality related data and analysis. The power quality metering module 120 may be configured to provide power quality analysis in compliance with the IEC 61000-4-30 standard class A.

The power meter 106 may include both hardware and software. Some of the hardware and/or software operable in the power meter 106 may be shared between the revenue class metering module and the power quality metering module. In addition, some of the hardware and/or software operable in the power meter 106 may be dedicated to the functionality of either the revenue class metering module 110 or the power quality metering module 120.

The hardware included in the power meter 106 may be analog and/or digital devices. In addition, the hardware may be solid state devices, electromechanical devices, mechanical devices, and/or some combination thereof.

The software included in the power meter 106 may enable processing of the measured power parameters within the power meter 106. The software configuration operable within the power meter 106 may be modified remotely or locally, and include both applications software and firmware. Firmware may be the low level operating code providing the basic functionality, or operating capability of the power meter 106. The firmware may be referred to as an operating system of the power meter 106. The firmware may include standard as well as optional components to support the functions of the power meter 106.

The applications software may include one or more software programs designed to derive, display, utilize and manipulate the data within the power meter 106 in at least one of the revenue class metering module 110 or the power quality metering module 120, or a combination thereof. In addition, applications software may include measurement and recording applications, derivation applications, measurement and control applications, communications applications and any other applications providing functionality to the power meter 106. The applications software may also include standard applications software and custom applications software. Standard applications software may include those applications developed by the manufacturer that may be provided as standard functionality within the power meter 106. Standard applications software typically includes instructions to perform the more usual and customary functions for which the power meter 106 is designed. Custom applications software includes those applications with instructions specifically tailored to the needs of an end user, or group of end users operating the power meter 106 in the field. Any applications software that is not "off the shelf" software may be considered custom applications software. Custom applications software may be developed by the end users, third parties, or by the manufacturer of the power meter 106 based on the specific in the field application of the power meter 106 within the power system 100.

Figure 2:
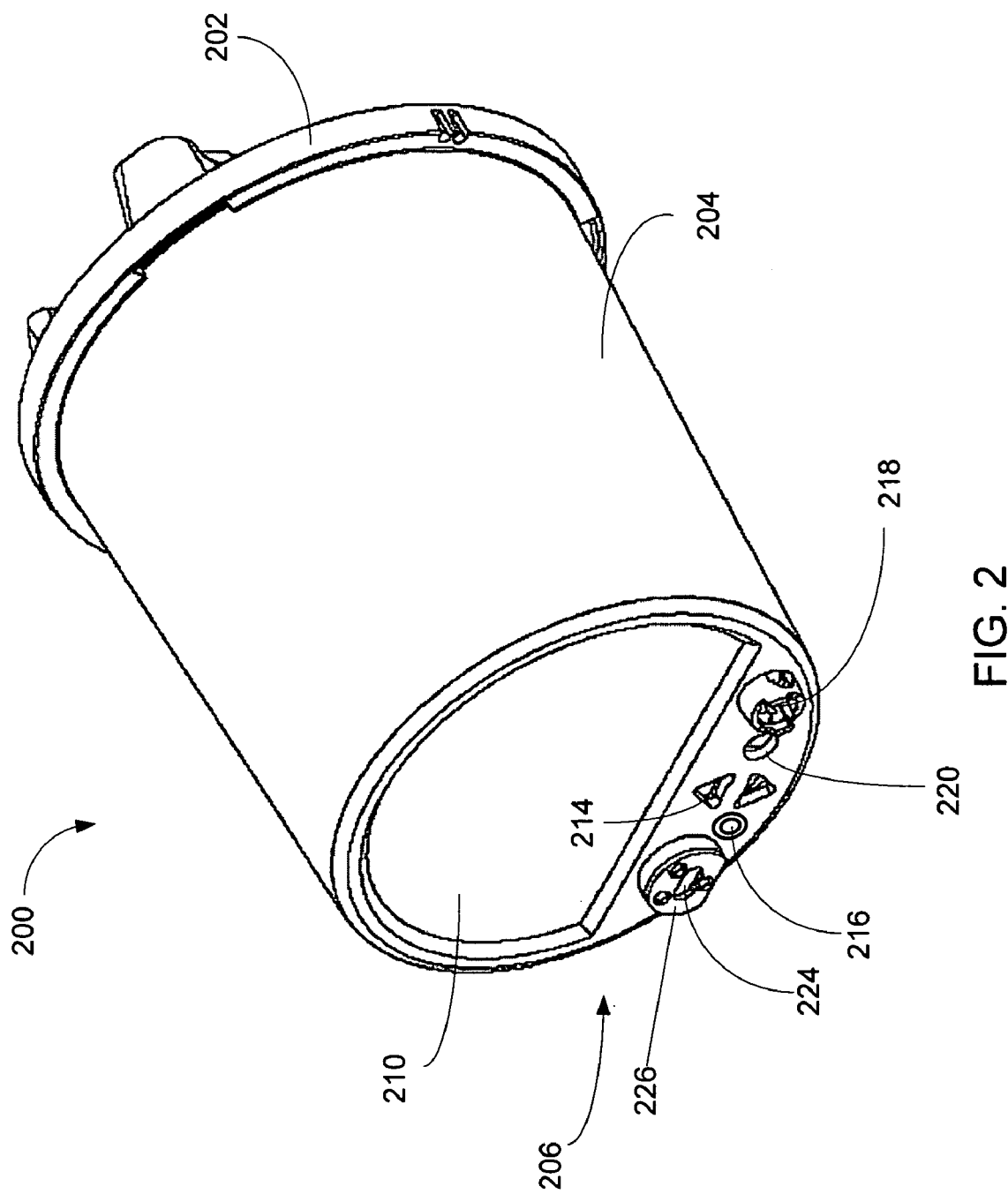
FIG. 2 is a perspective view of an example of the power meter of FIG. 1.

FIG. 2 is a perspective view of an example of a base mountable revenue class power meter 200. In FIG. 2, the illustrated power meter 200 is a socket base meter that can be referred to as an "S-base" or "Type S" meter. An exemplary S-base revenue meter is the 8600 ION Revenue Meter manufactured by Power Measurement Limited, Saanichton, British Columbia, Canada. In other examples, the power meter 200 may be a revenue class meter configured as an "A-base" or "Type A" meter, a switchboard meter, or a draw-out meter. These types of revenue meters may be distinguished, in at least one respect, by the method in which they are connected to the electric circuit that they are monitoring. Examples of such mountable meters are described in U.S. Pat. No. 6,792, 364 for a REVENUE METER WITH POWER QUALITY FEATURES, issued Sep. 14, 2004, which is herein incorporated by reference.

In FIG. 2, the power meter 200 includes a base 202, a meter housing 204 and a user interface 206. The base 202 may be configured with guides and blade type terminals to enable detachable mechanical coupling with a corresponding revenue socket (not shown). The meter housing 204 may be a generally hollow structure configured to house the hardware, such as circuit boards, power supplies, etc., included in the power meter 200 to create a secure environment isolated from external conditions and contact.

The user interface 206 may include a display 210, such as a liquid crystal display (LCD). In addition or alternatively, the display 210 may include indicators, such as light emitting diodes (LEDs), a screen, such as a plasma screen, a touch screen, etc. or any other visual interface. The display 210 may include a graphical user interface that allows display and manipulative capability of measured and/or derived electrical parameters, software, firmware, and/or any other functionality or information within, or accessible with the power meter 200. The display 210 may also enable a user to input data, configure parameters for the power meter 200, set controls, and/or receive information from the power meter 200, or any other device in communication with the power meter 200. The user may input a selection directly through the display 210, and/or may input data using any one of combinations of the other user interface devices, such as buttons, switches and knobs included on the power meter 200. For example, the user may scroll or navigate through an options menu to configure the power meter 200, assign communications protocols for the power meter 200, display output parameters, set input metering parameters, and/or control any other features of the power meter 200. The options menu may be a cascading or hierarchical menu where selections of options on a menu may provide a subset of options provided on another menu that is displayed to the user. The display 210 may also be used to provide a visual indication of the operation of the power meter 200.

The power meter 200 may be configured to provide multiple levels of security to protect the power meter 200 from being tampered with, or inadvertently or mistakenly misprogrammed. For example, access to the options menu and/or portions of the options menu may be accessible only after a user has entered a password or authentication code. Similarly, where the power meter 200 is being accessed for programming using an external processor in communication with the power meter 200 through a communications port, access to programming features may be set according to a password entered. The password may be associated with a high-level programming or calibrating access, such as by a third party manufacturer and/or calibrator. Another authorization level may be associated with general configurations set-up. For example, another password may be associated with general scrolling or navigating to select various outputs, and/or restricting inputs or reconfiguring of the power meter 200.

The level of access may be determined by a password or other authentication means, such as a biometric device, or any other mechanism for identifying a user. The power meter 200 may be accessed by multiple users, each having a distinct password. Access to various parameters of the power meter 200 may be determined or restricted by the password as well. For example, one user may have access only to power quality parameters based on the password associated with the user, and another user may have access to revenue parameters based on an associated password. Passwords also may restrict the user's privileges to read, or read and write data provided by the power meter 200.

The user interface 206 may also include a user input panel. The user input panel may include one or more manually manipulative buttons. In FIG. 2, the user input panel includes cursor button 214, a test mode button 216, a master reset button 218, and a demand reset button 220.

The cursor button 214 may be one or more buttons that enables a user to maneuver a cursor or other indicator in the display 210. The cursor button 214 may also include selection capability to select items within the display 210.

The test mode button 216 may toggle the power meter 200 between an operational mode and a test mode. During operation in the operational mode, the power meter 200 may provide and/or display various power system data, measured or derived power parameters, and meter related data. When toggled to the test mode, the power meter 200 may perform diagnostics to verify the meter's calibration and function. While in the test mode, the power meter 200 may read data from a test power supply while diagnostic functions are performed. Power parameters processed and recorded when the meter is in operational mode, such as those for billing purposes, may no longer be accumulated by the power meter 200 during operation in test mode. Such power parameters can include kilowatt hours (kWh), kilovar hours (kVARh), kilovolt amp hours (kVAh) and the like. Instead, during the test mode, the data may be stored in test mode registers. The values accumulated in the test mode registers can be reported either through a display or through a communications port.

The master reset button 218 may be a one-touch button capable of resetting the power meter 200 by deleting accumulated power parameter data stored in the power meter 200. The accumulated power parameter data may include measured and derived power parameter data. In one example, the master reset button 218 may delete energy and demand data, peak demand data, loss calculation data, power quality disturbance counter data, and time of use data previously processed and stored in the power meter 200. In addition, the master reset button 218 may delete event log data, recorded numerical data, and/or recorded waveform data. During an example testing operation, the master reset button 218 may be used during a verification process of the power meter 200. In this example, once the power meter 200 has been verified as accurate based on determined accuracy specifications, all values may be returned to zero with the master reset button 218, prior to the power meter being certified and placed in service.

The demand reset button 220 may reset the peak demand values logged in the power meter 200, such as peak demand values kW, kVAR, kVA and the like. A peak demand value is the highest demand value since the last peak demand reset event occurred.

Since the power meter 200 is a revenue class meter, the master reset button 218 and the demand reset button 220 may be configured as tamper proof buttons. In addition, the master reset button 218 and the demand reset button 220 may be capable of receiving a tamperproof seal. A tamper-proof seal is a physical device or mechanism that provides an indication when the seal(s) has been tampered with, or disturbed. The seal(s) may be made of various materials, and come in various designs, such as an adhesive strip design, a wire design, a lock design, a glass vial design, a plastic tie design, an electrical fuse design, a gravitational design and/or an inertial/shock detector design. For example, when the seal is a plastic tie, the seal may generally include a tab with a unique identifier, and a locking mechanism that cannot easily be opened without breaking or otherwise visibly altering the locking mechanism.

The power meter 200 may also have one or more tamperproof seals that protect different parts of the device. Types of tamper-proof seals that may be used include seals used as revenue/verification seals, utility seals, or metering point identification seals. A revenue/verification seal may be controlled by a third party and verifies the accuracy of the meter. In the event a revenue verification seal is disturbed or broken, the power meter 200 may need to be returned to the third party for re-verification and re-sealing prior to being further used in revenue calculations. A utility seal may be controlled by a user of the power meter 200, such as an electrician at a utility, to guard against tampering. A metering point identification seal is a seal that may be used to uniquely identify the power meter 200 and keep track of the location of the meter within a facility or system.

The seal(s) may be external or internal to power meter 200. The seal(s) may be attached during manufacture, during installation, or following installation. A tamper-proof seal can be applied to various parts of the power meter 200 to detect tampering. In addition, a seal can be applied to structure surrounding the power meter 200 to indicate removal and/or relocation of the power meter 200 with respect to the surrounding structure. For example, the power meter 200 of FIG. 2 may include a revenue verification seal coupled between the base 202 and the meter housing 204 to prevent access to the electronics of the power meter 200 without indications of tampering. In addition, the power meter 200 may include a utility seal between the base 202 and a socket (not shown) in which the power meter 200 is detachably mounted. Other example seal applications include application to an access door or cover included on the power meter 200, application to the master reset button 218, the demand reset button 220, or other control button included on the power meter 200, application to the casing of the power meter 200, application to input/output points, and/or application to an external enclosure around at least a portion of the power meter 200.

The power meter 200 may also include an infrared (IR) communication port 224. The IR communication port 224 may include a magnetic optical communication coupler 226. The magnetic optical communication coupler 226 may comply with American National Standards Institute (ANSI) C12.13 for Type II communication couplers and/or the section/s of IEC 61107 that define a physical coupler. The IR communication port 224 may communicate with a determined protocol, such as the communications protocol section/s of IEC 61107 for optical communication ports. The IR communication port 224 may be used for transmission of power parameters and the like. The mode of transmission is via infrared light with a typical wavelength of 800 nm-1000 nm. Data transmission may include transfer of data from a data register included in the power meter 200 to an optical reader that is coupled to the communication port 224 via the magnetic coupler 226. Any communication protocol may be useable with the IR communication port 224, such as ION, Modbus RTU, DNP 3.0, Factory, or GPS protocols. In addition, or alternatively, the communication protocol may be wrapped by another protocol specific to optical transmission, such as IEC 61107 or ANSI C.12.18.

Figure 3:
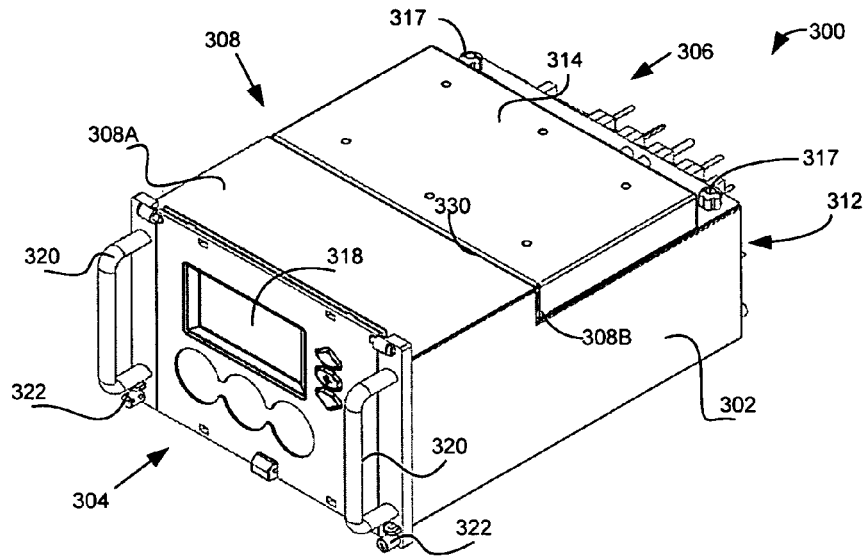
FIG. 3 is a perspective view of another example of the power meter of FIG. 1.
Figure 4:
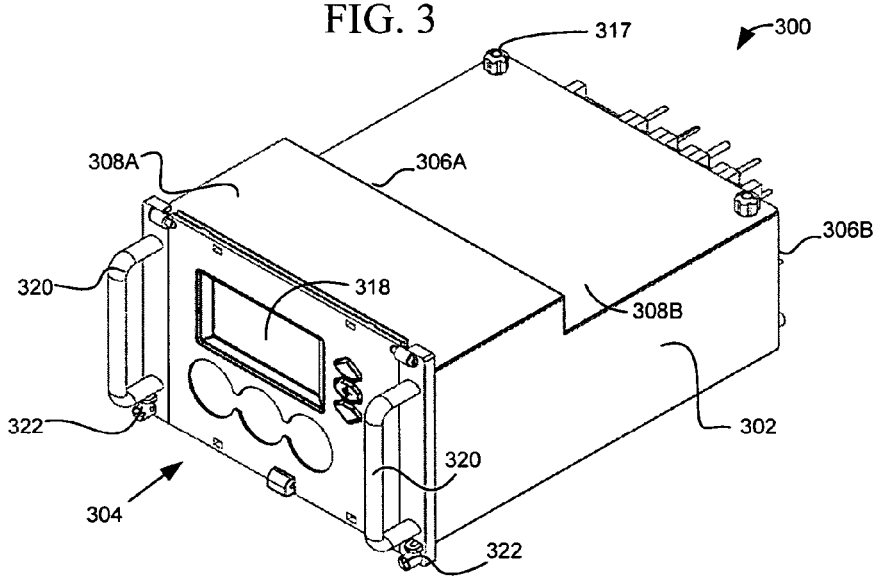
FIG. 4 is another perspective view of the power meter of FIG. 3 with a portion of the power meter removed.
Figure 5:
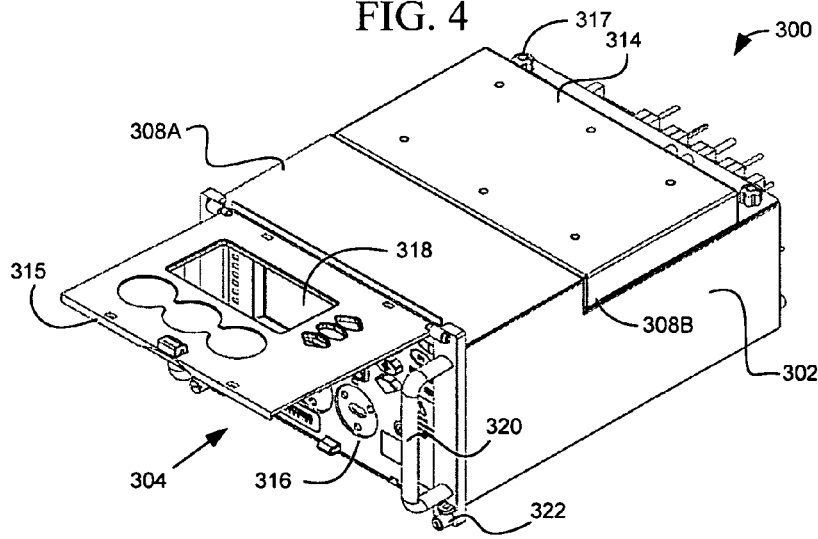
FIG. 5 is another perspective view of the power meter of FIG. 3 with a cover in an open position.

In another example, the power meter may be a revenue class meter that is rack mountable. FIGS. 3, 4 and 5 are perspective views of an example rack-mountable revenue class power meter 300. The rack-mounted power meter 300 may be inserted and mounted to an equipment rack assembly (not shown). The equipment rack assembly may provide an electrical connector having an input/output (I/O) interface and operating power for the power meter 300. The rack-mounted power meter 300 may be designed with a form factor having maximum external dimensions, such as dimensions that allow the rack-mounted meter to be used as a 48.3 centimeter equipment rack mounted meter. The rack-mounted power meter 300 may be calibrated, and its meter housing may be sealed before being installed in a bay of an equipment rack assembly. The dimensions of the power meter 300 are implementation dependent and may vary depending upon the type of equipment rack and standard dimensions supported therein.

The power meter 300 may be sealed by including one or more tamper proof seals on/in/around the power meter 300, as previously discussed. The rack-mounted power meter 300 may also integrate both power revenue metering and power quality class metering within an external form factor that may be rack-mounted in a bay. Accordingly, the rack-mounted power meter 300 may provide power quality detection, monitoring, reporting, recording, analysis and communication along with revenue accuracy measurement and reporting. The rack-mounted power meter 300 may integrate the features of power quality monitoring and revenue metering in a single power meter having a meter housing meeting the form factor requirements for installation and mounting in a bay of an equipment rack assembly.

The rack mounted power meter 300 includes a meter housing 302. The meter housing 302 may have an external form factor, or frame structure, that is dimensioned to allow rack mounting of the power meter 300 in a bay of an equipment rack. Thus, an outer envelope of the meter housing 302 may be formed to fit within at least one bay of an equipment rack. The meter housing 302 may include at least six sides, and may be generally characterized by width, height, and length dimensions. The meter housing 302 provides mechanical protection for metering circuitry included in the meter housing 302. The meter housing 302 may be configured as an IP51 enclosure as set forth by IEC 529, providing protection to the metering circuitry against inadvertent intrusion of tools and/or wires over 1 mm in diameter. The meter housing 302 also may provide protection against vertically falling drops of water, condensation and other moisture. The meter housing 302 may be designed to minimize holes, cutouts, spot welded tabs, folded seams, and connector openings, and may have a rust inhibiting coating such as a powder coat finish, paint, or other protective coating. The meter housing 302 may provide mechanical protection, fire protection, electromagnetic protection against radio-frequency interference, and electrical shock protection.

The meter housing 302 may include a two-tiered surface 308 that includes a first portion 308a and a second portion 308b. In FIGS. 3 and 4, the first portion 308a is a front portion and the second portion 308b is a rear portion of the meter housing 302. The first portion 308a may be substantially planar across the width of the two-tiered surface 308, and extend a predetermined depth of the meter housing 302 from a front panel 304 of the rack-mounted power meter 300 towards a mid portion of the two-tiered surface 308. The second portion 308b, or slot, may be substantially planar across the width of the meter housing 302 and extend from the mid portion to an end of the meter housing 302, such as the rear of the meter housing 302. The second portion 308b may be recessed from the first portion 308a to form a slot.

The meter housing 302 may also include an electrical connector panel 306. The electrical connector panel 306 may include a first connector panel 306a and a second connector panel 306b. The first connector panel 306a may be a step or shoulder formed as a portion of the meter housing 302 that connects the first portion 308a of the two-tiered surface 308 to the second portion 308b. The first connector panel 306a may be substantially planar across the width of the meter housing 302, and may be positioned approximately orthogonal to both the first portion 308a and the second portion 308b of the two-tiered surface 308.

FIGS. 3 and 5 illustrate a metering options module 314 that is designed to be coupled with and mounted to the rack-mounted power meter 300. FIG. 4 illustrates the rack-mounted power meter 300 without the metering options module 314 coupled with the rack-mounted power meter 300. The enclosure of the metering options module 314 may be characterized by a width, height, and length dimensions. The metering options module 314 may include a housing that is designed to provide mechanical protection for circuitry enclosed within similar to that described above for the meter housing 302 of the rack-mounted power meter 300. In the illustrated example, the enclosure of the metering options module 314 has six sides. In another embodiment, the metering options module 314 may include a housing that is completed after the metering options module 314 has been mounted to, or otherwise installed on, the rack mounted power meter 300, e.g. the metering options module 314 features at least one open face that is covered by a face of the power meter 300 when the metering options module 314 is installed. In this example, the metering housing 302 may be a sealed unit that is an IP51 enclosure as set forth by IEC 529. In addition, or alternatively, the housing formed by the combination of the metering options module 314, and the meter housing 302 may be an IP51 enclosure as set forth by IEC 529.

The metering options module 314 may be coupled with the rack-mounted power meter 300 proximate the two-tiered surface 308. The surface of the second portion 308b of the rack-mounted power meter 300 may be recessed from the surface of the first portion 308a a determined distance that allows the metering options module 314 to be mounted contiguous with the second portion 308b. In one example, the uppermost portion of the metering options module 314 may be substantially flush with the first portion 308a. That is, a height of the first portion of the first connector panel 306a is at least the height of an upper surface of the metering options module 314. In addition, the length of the second portion 308b may be at least as long as a length of the metering options module 314, and the width of the metering options module 314 may be no wider than the width of the rack-mounted power meter 300. In the illustrated example, the length of the second portion 308b is slightly longer than the metering options module 314 to allow room for connectors and associated conductors, such as signal cables, to be terminated at the metering options module 314.

Accordingly, when the metering options module 314 is affixed to the power meter 300, the metering options module 314 may be substantially flush with the upper surface 308a. In one example, the exposed upper surface of the metering options module 314 does not extend beyond the upper surface 308a. Additionally, or alternatively, the external dimensions of the power meter 300 with the metering options module 314 mounted thereto may not exceed the maximum dimensions required for the power meter 300 and the metering options module 314 to be installed in a bay of an equipment rack assembly. Thus, an outer envelop of the power meter 300, with our without the metering options module 314, may be dimensioned to fit within the dimensions of a bay of an equipment rack assembly and be securely mountable therein.

The metering options module 314 may be coupled with the meter housing 302 with a fastener 317. The fastener 317 may be a screw, a rivet, a clasp, a latch, a snap, or any other mechanism capable of holding the metering options module 314 in position on a surface of the meter housing 302. In FIGS. 3-5, the fastener 317 is a plurality of fasteners each formed with a threaded post and a nut. In other examples, any other form of fastener, in any other position capable of coupling the metering options module 314 and the meter housing 302 may be used.

FIGS. 3 and 5 illustrate an example metering options module 314 mounted substantially flush with the two-tier upper surface 308 of the rack-mounted power meter 300. In other examples, the metering options module 314 may be otherwise coupled with the rack-mounted power meter 300. For example, the metering options module 314 and rack-mounted power meter 300 may be configured with a two-tier side surface, or a two tiered bottom surface, where the metering options module 314 is mounted to be no greater than flush with the external dimensions of the rack-mounted power meter 300. Alternatively, or in addition, additional external surfaces of the power meter 300 may be two-tiered to allow more than one metering options module 314 to be mounted to the rack-mounted meter 314 and yet stay within the dimensions of a bay of an equipment rack.

The metering options module 314, when mounted on the power meter 300, may have a first surface that is contiguous with the second surface 308b, and a second surface opposite the first surface that is substantially flush with the maximum external dimensions of the meter housing 302. Thus, the first surface of the metering options module may be substantially parallel with a surface of the second portion, and the second surface of the metering options module 314 may be in substantially the same plane with the surface of the first portion 308a of the power meter 300.

In another example, the meter housing 302 may have a slot, cavity or opening in which the metering options module 314 may be inserted. The slot may be formed in the front, back, top, bottom or side of the power meter 300, and be an externally accessible surface of the metering housing 302. The meter housing 302 may form the cavity. The meter housing 302 may remain a sealed unit that is an IP51 enclosure as set forth by IEC 529. A hinged or otherwise movable cover, or trap door, may be positioned to cover an entrance to the cavity.

The cover may be moved from a closed position to an open position to allow the metering options module 314 to be inserted into the cavity through the entrance. The metering options module 314 may be securely held in the cavity with the cover. The cover may minimize entry of dust and moisture into the cavity. In addition, the cover may have a security mechanism such as a lock and key, a biometric device, such as a fingerprint scanner, or any other device that provides verification of identity so that only authorized personnel are allowed access to the cavity. In addition, or alternatively, the cover could be sealed with a tamper proof seal, such as a utility seal, and/or a revenue seal once the metering options module 314 is installed in the cavity and the cover is moved to a closed position. The number and type of tamper proof seal(s) is dependent on the operational functionality of the metering options module 314.

The metering options module 314 represents self-enclosed, sealed, additional functionality that may be added to the power meter 300. Such functionality may include additional power parameter processing capability, signal conditioning capability, input/output capability, and/or any other hardware, firmware and/or software to reconfigure, enhance, or otherwise change the functionality of the power meter 300. In one example, the metering options module 314 may provide enhanced communication capability and associated input/output hardware. In another example, the metering options module 314 may provide increased capability to transmit and receive input and/or output signals. In still other examples, the metering options module may provide hardware, software and input/output signal capability to enable protective relaying functionality. In yet another example, the metering options module 314 may provide additional power quality event hardware, software and input/output capability.

The front panel 304 of the rack-mounted power meter 300 may have a flip-up cover 315. FIGS. 3 and 4 illustrate the rack-mounted power meter 300 with the cover 315 in a closed position, and FIG. 3 illustrates the cover 315 in an open position. The flip-up cover 315 may be hinged so that the cover 315 swings through an arc to an open position, exposing a control panel 316. At least a portion of the control panel 316 may be located underneath or behind the cover 315. Other portions of the control panel 316 may be accessible when the cover 315 is in a closed position. The control panel 316 may include connectors, such as analog, digital and/or optical connectors. In addition, the control panel 316 may include user interface devices, such as, buttons, knobs, switches or any other user input/output devices or mechanisms that provide access and control of the power meter 300, as previously discussed with reference to the power meter 200 of FIG. 2.

With the cover 315 closed, one or more connectors, buttons, switches, and/or other user interface devices for access and control of the power meter 300 may be covered and inaccessible, while other connectors, buttons, switches, and/or any other user interfaces may be accessible through the cover 315. In addition, user interface devices may be included on the cover. Access to controls when the cover 315 is in the closed position may include only that functionality that will not affect operation. The remaining controls may be inaccessible to a user with limited security access when the cover 315 is closed. When additional control inputs are to be provided to the power meter 300, the cover 315 may be opened, exposing the features beneath.

A screen 318, such as an LCD, LED, plasma or other digitally controlled display may be positioned on the front panel 304. The screen may be a touch-screen device allowing a user to input data and selections by touching appropriate areas on the screen 318. The screen 318 may be viewable with the cover 315 in the closed and opened positions. Thus, the screen 318 may be positioned on the control panel 316 or mounted on the cover 315. In one example, when the screen 318 is on the control panel 316, portions of the screen 318 may be blocked when the cover 315 is closed, e.g. to prevent viewing of particular data.

The front face 304 may be configured to be mounted and affixed to corresponding members of a standard equipment rack system. The front face 304 may have handles or grab bars 320 that allow an installer to carry the power meter 300, and to position the power meter 300 in or with an equipment rack assembly. The handles 320 may be installed at the front face 304 towards the vertical edges of the front panel 304. The front panel 304 also may include a mechanical coupler 322, such as a screw, bolt, or wing nut that allows the power meter 300 to be affixed to a rack assembly. The mechanical coupler 322 may also be used to form a tamper proof seal, such as a utility seal so that the power meter 300 cannot be removed from the equipment rack without disturbing, damaging, or otherwise changing the tamper proof seal to indicate such activity has occurred.

Figure 6:
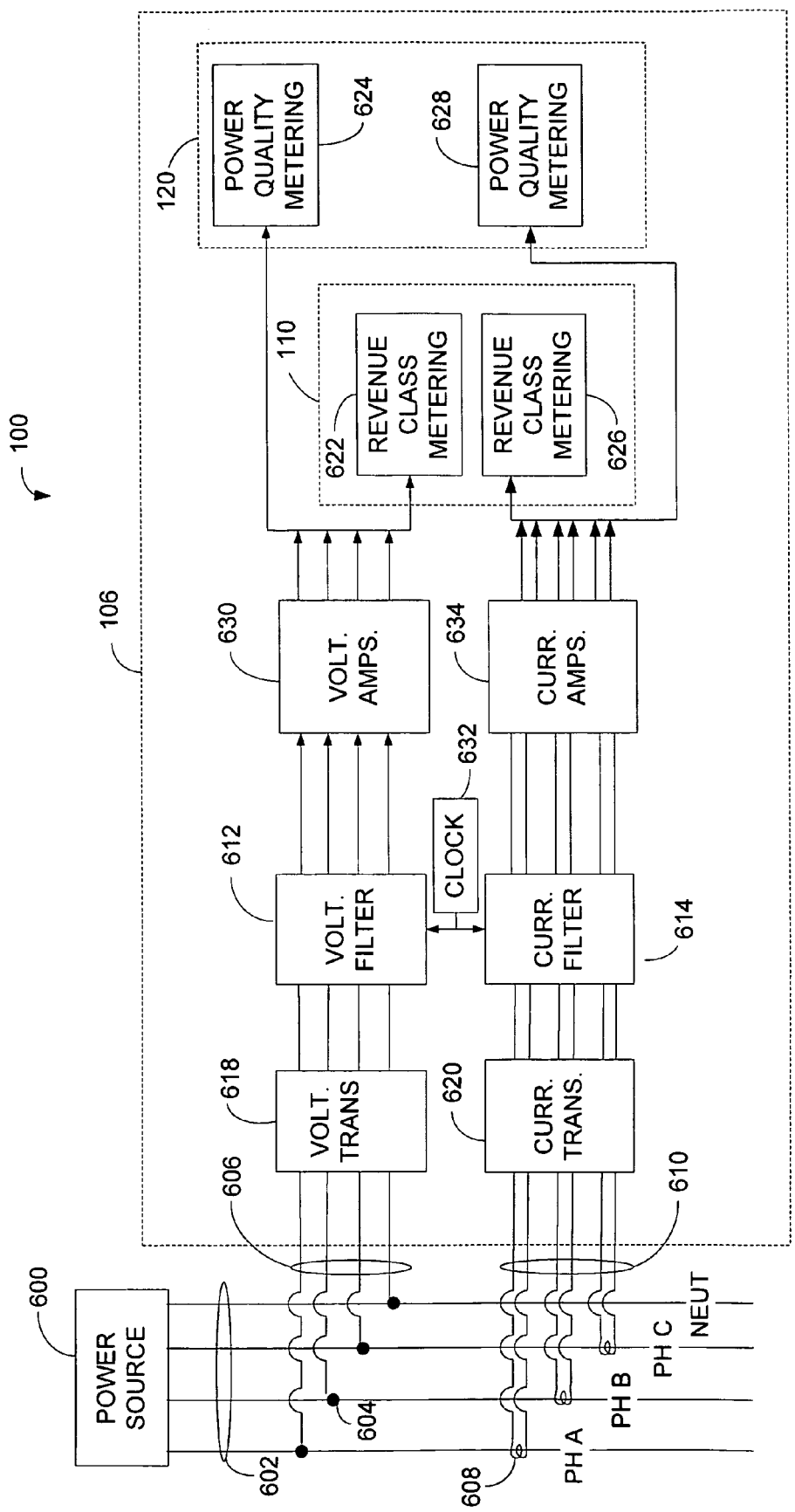
FIG. 6 is a block diagram of another example power system that includes a power meter.

As described with reference to FIG. 1, the power meter 106 includes a revenue class metering module 110 and a power quality metering module 120. FIG. 6 is a more detailed block diagram of an example of the functionality of the power system 100 and the power meter 106 that includes the revenue class metering module 110 and the power quality metering module 120.

As previously discussed, the revenue class metering module 110 and the power quality metering module 120 both use the same power parameter signals measured from the conductors 102. In FIG. 6, a power source 600, such as the illustrated three phase power source, includes a plurality of conductors 602. The conductors 602 may feed a load or a portion of a power system. The power meter 106 may be coupled with the conductors 602 to receive and process electrical parameters representative of electrical energy present in the conductors 602.

A plurality of voltage channels 606 may be coupled with the conductors 602 and the power meter 106 to provide voltage signals indicative of the frequency, magnitude, and phase of the voltage present on one or more of the conductors 602.

The power meter 106 may include a plurality of voltage sensors 604 to sense the voltage in the conductors 602. The voltage sensors 604 may be potential transformers (PTs) or any other form of sensing device capable of generating a signal representative of the voltage present in the respective conductors 602.

The power meter 106 may also include a plurality of current sensors 608 to sense the current preset in the conductors 602. The current sensors 608 may be a plurality of current transformers (CTs). Alternatively, the current sensors 608 may be separated away from the power meter 106. The current sensors 608 may generate current signals on a plurality of current channels 610. The current signals may be indicative of a magnitude of current flowing in one or more of the conductors 602.

Each of the voltage sensors 604 may be coupled with one or more voltage transducers 618. In addition, each of the current sensors 608 may be coupled with one or more current transducers 620. The voltage transducers 618 may be any mechanism or device capable of receiving the voltage signals and converting or otherwise altering the voltage signals to a voltage level that is compatible with further processing in the power meter 106. An example of a voltage transducer 618 is a potential transformer (PT). The converted voltage signals may be generated with the voltage transducers 618 to maintain accurate representation of the frequency, phase and magnitude of the voltage signals generated by the voltage sensors 604. Accordingly, the voltage representations of the voltage signals will also be referred to as simply "voltage signals."

The current transducers 620 may be any mechanism or device capable of converting the current signals to corresponding voltage signals in a voltage range that is compatible with further processing in the power meter 106. An example of a current transformer 620 is a burden resistor. Wherein, the burden resistor will produce a voltage proportional to the current flowing through it. Said voltage can be represented by the formula voltage=current*resistance (V=I*R). The converted current signals may be generated with the current transducers 620 to maintain an accurate representation of the frequency, phase and magnitude of the current signals generated by the current sensors 608. Thus, the converted current signals, although represented with a voltage, will also be referred to as "current signals." Each of the voltage transducers 618 and current transducers 620 may provide analog output signals that are voltage representations of the respective voltage and current in the conductor 602.

The converted voltage signals may each be fed from the voltage transducers 618 to a voltage filter 612, and the converted current signals from the sensors 608 may each be fed from the current transducers 620 to a current filter 614. In another example, the voltage filter 612 and the current filter 614 may be configured to be coupled directly with the voltage sensors 604 and the current sensors 608, and the voltage transducers 618 and the current transducers 620 may be omitted. The voltage and current filters 612 and 614 may reduce noise, transients, harmonics and any other undesirable signal content that may be present on the voltage channels 606 and/or the current channels 610. In one example, the voltage and current filters 612 and 614 may be low pass filters. The voltage and current filters 612 and 614 may attenuate high frequency signal components greater than about 3 kHz. Alternatively, or in addition, the voltage and current filters 612 and 614 may attenuate high frequency signal components that are greater than about 7 kHz. Alternatively, or in addition, the voltage and current filters 612 and 614 may attenuate frequencies starting at a frequency substantially higher than the highest harmonic under measurement yet substantially low enough to attenuate higher frequencies that will alias into the passband. For example, if the highest frequency to be measured is the 50th harmonic, which for a 60 Hz signal would be 3 kHz, the attenuation of the signal should start at a frequency substantially higher than 3 kHz to avoid any unwanted attenuation of the passband signals. The amount higher than 3 kHz is dependent on the type of filter that is used, in particular the passband characteristics of the filter. In the context of attenuation frequency and passband ranges the term "about" is given as +/−2 kHz.

The voltage and current filters 612 and 614 may be any type of digital and/or analog integrated circuit filter. In one example, each of the voltage and current filters 612 and 614 may include digital filters that include a processor and memory. The memory may include instructions executable by the processor to reject high frequency components and/or noise in the frequency domain. The memory may also include filter parameters that are set by a user to characterize the operational functionality of each of the voltage and current filters 612 and 614. Alternatively, or in addition, the voltage and current filters 612 and 614 may be discrete component analog and/or digital filters or a combination of discrete component(s) and integrated circuit(s) analog and/or digital filters.

In one example, the voltage and current filters 612 and 614 may be integrated circuit filters that are continuous-time low pass filters. The continuous time filters may be Butterworth filters, Bessel filters, Chebyshev filters, Bessel filters, Elliptical filters, Raised Cosine filters, Sigma Delta filters, and/or any other type of filter design operable in continuous time as a low pass filter. When the voltage and current filters 612 and 614 are continuous time filters, an external clock is unnecessary since the filters are implemented in the time domain as "analog filters." Accordingly, there is not a digitally sampled input signal. Instead, a continuous-time filter may use cascaded components, such as operational amplifiers (op-amps). The number and complexity of the components cascaded together can determine the order of the filter circuit. An integrated circuit type of continuous-time filter may also include external discrete components to properly tune a corner frequency ($f_c$) of the filter. The external components may be within a determined tolerance with respect to each other, such as within +/−1%, to substantially match the operation of filters operable with different input signals. The determined tolerance may minimize variation in the phase shift between different circuits using different continuous-time filters. An example continuous time filter is the LTC1563-2-Active RC, $4^{th}$ Order Lowpass filter manufactured by Linear Technology of Milpitas, Calif.

In another example, the voltage and current filters 612 and 614 may be integrated circuit filters that are switched-capacitor filters. When the voltage and current filters 612 and 614 are switched-capacitor filters, an external clock is needed since switched capacitor filters are configured to sample an analog signal during filtering. Due to the sampling, switched capacitor filters may be considered a digital filter, however, due to a significant analog processing that occurs in the switched-capacitor filter, it may be considered an "analog filter." Accordingly, as used and discussed herein, switched capacitor filters will be described as "analog filters."

During operation, a switch-capacitor filter may charge and discharge capacitors by periodically opening and closing switches positioned on either side of the capacitor. This generates a charge transfer that results in a pulsing current flow. The average current can be calculated and can be equivalent to a current through a resistor if the switching frequency is high enough. Thus, in general, a resistor is replaced by a capacitor. The amount of current, and thus the resistor value, is dependent on the size of the capacitor, and the switching frequency of the switch-capacitor filter. The higher the switching frequency, or the larger the capacitor, the higher the current, or conversely, the lower the resistance value may be. Accordingly, the frequency behavior of a switch-capacitor filter can be changed by changing either the capacitor size or the switching frequency. In an integrated solution, the capacitor value is fixed, so the filter characteristic may be modified by changing the switching frequency. An example of a switched capacitor filter is a MAX 7419 manufactured by Maxim Integrated Products Incorporated of Sunnyvale, Calif.

When the voltage and current filters 612 and 614 are implemented as analog low pass filters, a corner frequency ($f_c$) and a gain may be set to configure the operational characteristics of the filters. The corner frequency ($f_c$) and gain may be set to be substantially the same for all of the voltage and current filters 612 and 614. In addition, a non-linear constant phase shift of signals propagated through the voltage and current filters 612 and 614 may be configured to be substantially the same for all of the voltage and current filters 612 and 614.

Figure 7:
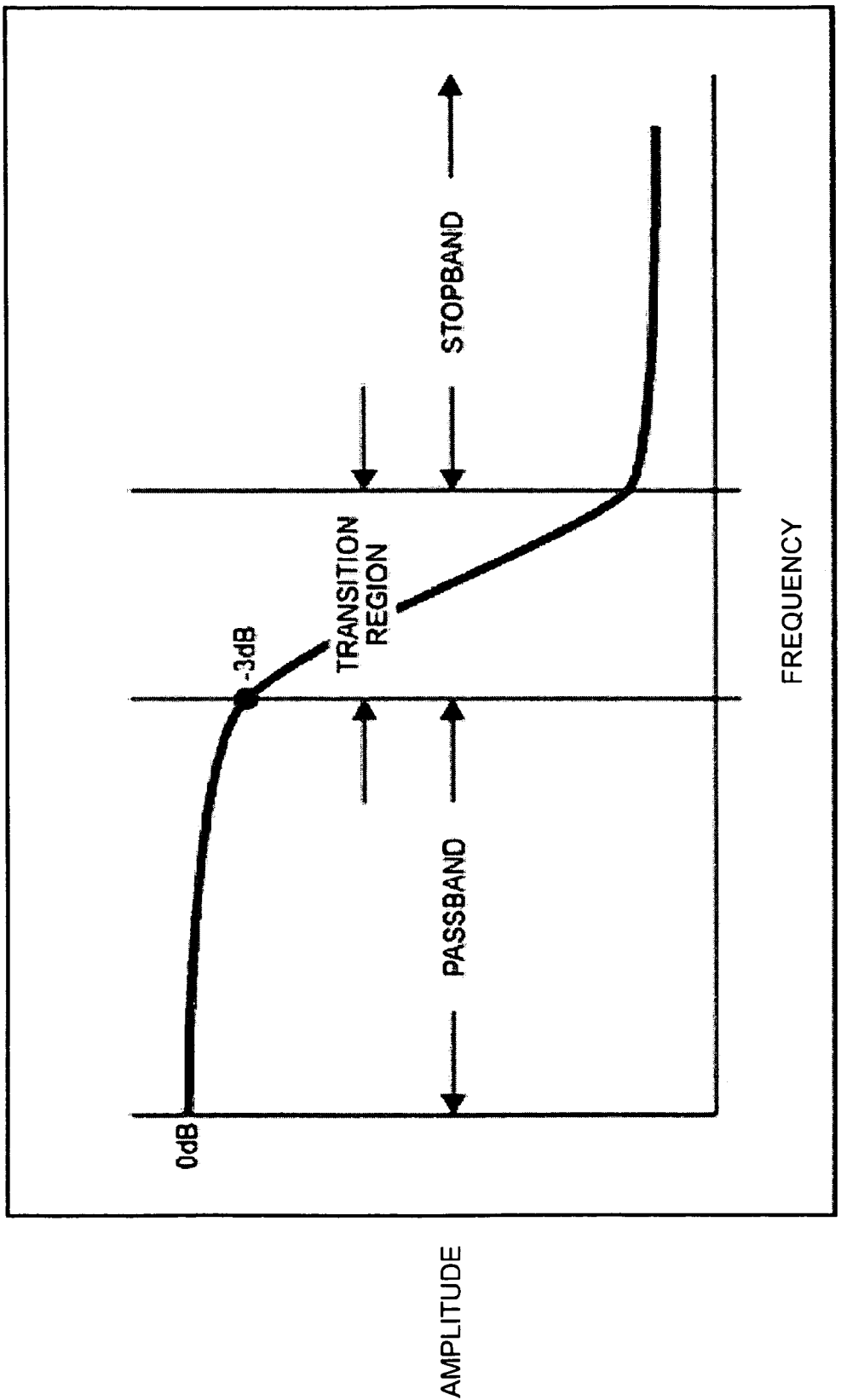
FIG. 7 is an example impulse response of a pass band filter.

The corner frequency ($f_c$) of the voltage and current filters 612 and 614 may be set to designate a transition frequency range between a desired passband and a desired stopband of the voltage and current filters 612 and 614. The stopband is a continuous band, or range, of frequencies specified by the design parameters of the analog filter in which a filter attenuates, or rejects signals. The passband is a continuous portion of the frequency spectrum that is transmitted through the filter with minimum relative loss of signal content. A transition region is a range of frequency between the end of the passband range and the beginning of the stopband range. For example, in Butterworth and Bessel type low pass analog filters the corner frequency ($f_c$) may be the frequency where the input signal to the filter is −3.01 dB with reference to the passband amplitude as illustrated in FIG. 7. In other examples, any other values of the corner frequency ($f_c$) may be implemented dependent on the type of filter and the desired passband and stopband for the filter.

Referring again to FIG. 6, the gain of the voltage and current filters 612 and 614 may be the ratio of an output voltage of a signal processed therethrough, versus an input voltage of the signal. Accordingly, the gain of the voltage and current filters 612 and 614 may act as a multiplier of the respective voltage and current signals. For example, if the gain of the voltage and current filters 612 and 614 is 1.2, then the signal magnitude may be increased by a factor of 1.2. The voltage and current filters 612 and 614 may be configured with a constant gain over the entire passband. With regard to the voltage and current revenue class metering module 622 and 626, it is preferable that the gain be substantially unity (gain=1.0) to minimize differences in gain of the voltage and current signals.

The phase shift of the voltage and current signals when propagated through the respective voltage and current filters 612 and 614 may be non-linear, constant, and substantially the same in order to maintain the phase relationship for the voltage and current revenue class metering modules 622 and 626. Such a phase shift may have little effect on the voltage and current power quality metering modules 624 and 628 due to the type of processing performed therein. Phase shift refers to the amount that an input signal is shifted in time due to signal propagation delay as the signal propagates through a respective filter.

In FIG. 6, each of the conductors 602 may include a voltage and current that is out of phase, or in phase, with respect to each other. During operation, the power meter 106 may receive, at substantially the same time, power parameters indicative of the voltage and current in each of the conductors 602. With regard to the voltage and current revenue class metering modules 622 and 626 maintaining the phase relationship of the power parameters with respect to each other is important in the processing and calculation of revenue accurate power consumption information for purposes of tariff billing. For example, calculation of the kilowatt hour (kWH) or kilovar hour (kVAH) consumption in a three phase system would require consideration of the phasing, and thus the three voltage and current signals represent of each phase may be captured at substantially the same time to maintain the correct phase relationship therebetween. Dissimilar phase shifts among the voltage and current signals being processed may adversely affect accuracy, and thus, the revenue calculations performed with the voltage and current revenue class metering modules 622 and 626.

Within the power meter 106, the phase of the voltage and current signals may be uniformly shifted in time by a constant, non-linear amount by each the voltage and current filters 612 and 614 as the signals are processed. The voltage and current filters 612 and 614 may be configured with substantially the same corner frequency ($f_c$) and gain to maintain substantially, such as within +/−0.1°, the same non-linear constant phase shift among different voltage and current filters 612 and 614. In addition, further minimization of differences in signal propagation delay may involve component selection and circuit configuration of the voltage and current filters 612 and 614, or any other parts of the power meter 106. Further, timing within the voltage and current filters 612 and 614 may be substantially synchronized. As used herein, the term "substantially synchronized" refers to the timing between the voltage and current filters 612 and 614, or portions thereof, remaining within +/−1% of each other. In addition, "substantially synchronized" may refer to differences in timing between each of a number of voltage filters 612 and/or a number of current filters 614 remaining within +/−1% with respect to each other.

In one example, a common clock 632 may be included in the power meter 106. The clock 632 may be external to the voltage filter 612 and the current filter 614. Alternatively, the clock 632 may be included in one of the voltage filter 612 and the current filter 614. The clock 632 may be a digital clock formed with an integrated circuit or an analog clock formed with passive components, such as an RC circuit, or a crystal oscillator with a determined output frequency. The clock 632 may provide a common clock signal to each of the voltage filter 612 and the current filter 614. The common clock signal may maintain a similar phase shift of the voltage and current signals when processed with the voltage and current filters 612 and 614. The common clock signal may provide common control that results in substantially synchronized corner-frequency ($f_c$) control, substantially synchronized predetermined signal propagation delay (phase shift) and substantially synchronized signal gain of all of the voltage and current filters 612 and 614.

In one example, the voltage and current filters 612 and 614 may be analog filters, and the clock 632 may be a digital clock generating digital common clock signals. In this example, the digital common clock signal may be designed and/or routed to be provided to the voltage and current filters 612 and 614 so as to avoid introducing noise from the digital common clock signal into the voltage and current filters 612 and 614.

Figure 8:
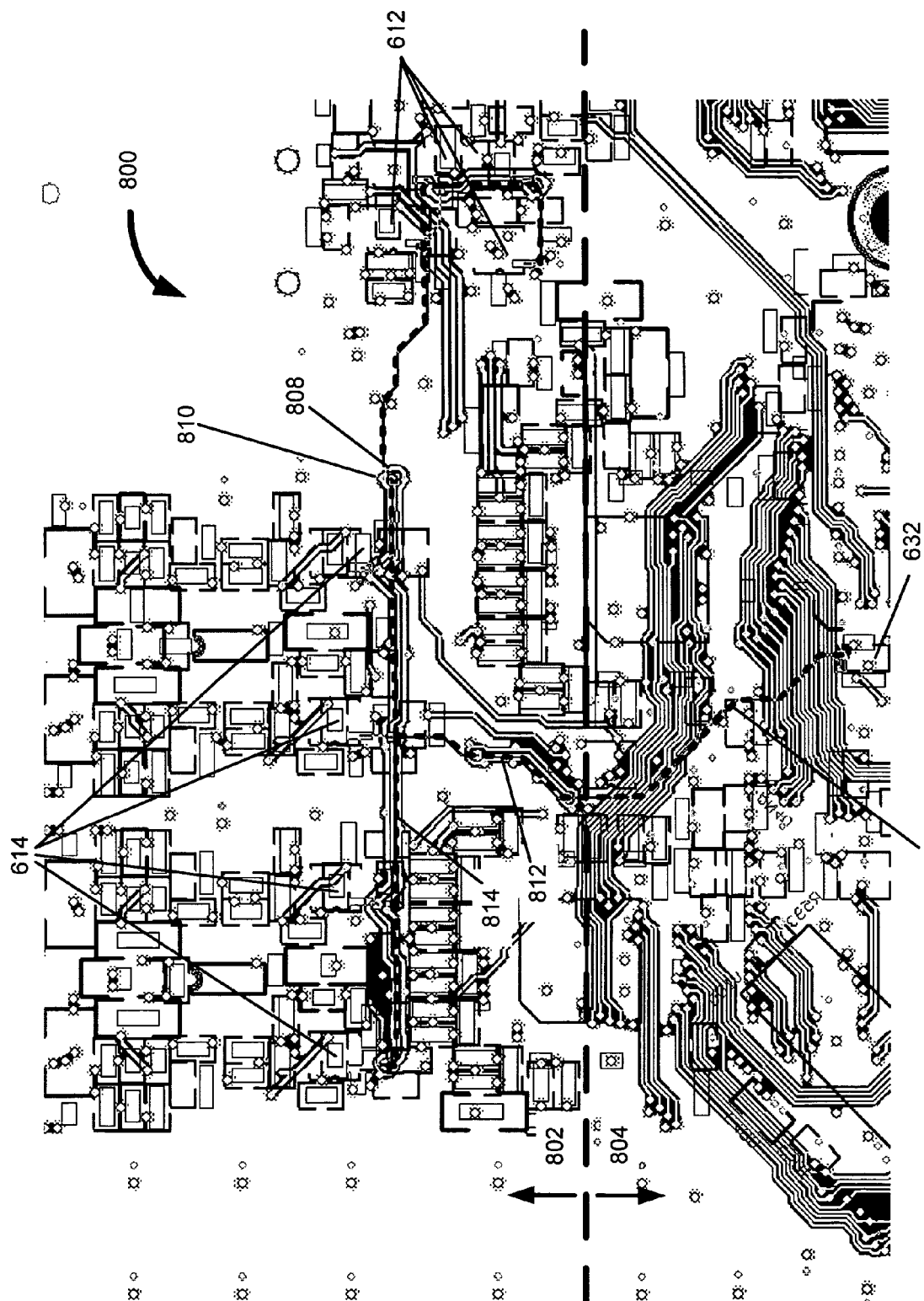
FIG. 8 is a portion of a printed circuit board useable in the power meter of FIG. 1.

FIG. 8 is diagram of a portion of a printed circuit board (PCB) 800. The example PCB 800 includes an analog section 802 and a digital section 804. The voltage filters 612 and the current filters 614 may be formed and operable in the analog section 802. The clock 632 may be formed and operable in the digital section 804. The PCB 800 may also include a digital clock trace 806 that couples the clock 632 to the voltage filters 612 and the current filters 614. The digital clock trace 806 may be routed from the digital section 804 to the voltage filters 612 and the current filters 614 included in the analog section 802.

The PCB 800 may also include a ground plane 808. The digital clock trace 806 may be wrapped with the ground plane 808 to minimize noise in analog signals included in the analog section 802. In addition, the digital clock trace 806 may be coupled with the ground plane 808 in multiple locations by way of vias 810 to reduce current flow in any one coupling between the digital clock trace 806 and the ground plane 808. The digital clock trace 806 may also be routed to each of the voltage filters 612 and the current filters 614 so that the length of the signal path is substantially the same between any one of the voltage filters 612 or the current filters 614 and the clock 632. As used herein, the length of the signal paths are considered "substantially the same" when one of the signal paths is not more than ten times the length of another of the signal paths. The actual length of the signal path is dependent on the frequency of the clock. Specifically, the higher the clock speed the closer the signal lengths need to be relative to each other. In FIG. 8, the digital clock trace 806 includes a first trace route 812 that is a common signal path, and a second trace route 814 that is a bus to which all of the voltage filters 612 and the current filters 614 are coupled in parallel.

Referring again to FIG. 6, one issue that can arise when analog filters are used for the voltage and current filters 612 and 614 is holes in a stopband of the filter. Due to manufacturing tolerances of components, operational properties of the topology of the analog filters, etc., holes may be present in the stopband. During operation, such holes in the stopband are manifested by the measurement of signals in frequencies that should have been attenuated by the stopband. These unwanted signals may be aliased into a passband of the respective analog filter. These aliased signals can increase the magnitude of the passband frequencies, which can skew the measured results for a revenue class power meter.

In one example, each of the voltage and current filters 612 and 614 may include an analog filters previously described, and a digital filter. The digital filter may be configured to attenuate frequencies present in holes in the stopband of a corresponding analog filter coupled in series therewith. The digital filters may be applied to a digital representation of the analog signals that have been filtered with the analog filters. Each of the digital filters may include a determined corner frequency ($f_c$) that may attenuate the unwanted aliased signals resulting from the holes in the analog filters. The determined corner frequency ($f_c$) of the digital filters may be a transition frequency range between the passband and stopband of the analog filter. Similar to the analog filters, the corner frequency ($f_c$) and gain of each of the digital filters may be substantially the same to standardize, or make substantially the same, such as within +/−0.1°, a continuous, non-linear phase shift of signals propagated through the digital filters.

The filtered voltage and current signals may be modified by adjusting the magnitude and/or format with a respective voltage amplifier 630 and a current amplifier 634. In another example, the filtered or unfiltered current and voltage signals may be used directly without modification and the voltage amplifier and/or the current amplifier 630 and/or 634 may be omitted.

The filtered, and/or modified, or not, voltage signals may be provided to a voltage revenue class metering module 622 and a voltage power quality metering module 624. The voltage revenue class metering module 622 and the voltage power quality metering module 624 may be coupled with the voltage amplifier 630 in parallel to receive the voltage signals as illustrated in FIG. 6. In addition, the filtered and/or modified, or not, current signals may be provided to a current revenue class metering module 626 and a current power quality metering module 628. The current revenue class metering module 626 and the current power quality metering module 628 may be coupled in parallel with the current amplifier 634 to receive the filtered measured current signals.

The combination of the voltage and current revenue class metering modules 622 and 626 form the previously discussed revenue class metering module 110. In addition, the combination of the voltage and current power quality metering modules 624 and 628 form the previously discussed power quality metering module 120.

When the voltage and current signals are filtered with the voltage and current filters 612 and 614, the frequency content of the voltage and current signals may be limited. Accordingly, higher frequencies present in the voltage and current signals may be attenuated. Since both power meter functionality and revenue class meter functionality is included, the voltage and current filters 612 and 614 may attenuate frequencies greater than a predetermined frequencies, such as greater than about 4 kHz.

In one example, the voltage and current filters 612 and 614 may be configured as anti-aliasing filters. Such anti-aliasing filters may be required in power quality processing due to the high frequency components that may be present in measured voltage and current signals. Since the high frequency components of the measured voltage and/or current signals may be greater than two times the sampling rate performed by the voltage and current power quality processing module 624 and 628, aliasing may appear in the frequency bands being sampled. When the voltage and current filters 612 and 614 are anti-aliasing filters, the filters 612 and 614 may be selected with a cutoff frequency that substantially eliminates, and/or minimizes the aliasing that may be present.

The addition of the voltage and current filters 612 and 614 may create a phase shift in the voltage and current signals due to inherent properties of operation as anti-aliasing filters. The functionality of the voltage and current power quality metering modules 624 and 628 may be unaffected by the phase shift due to the type of measurements being performed. However, the functionality, and thus accuracy of the voltage and current revenue class metering modules 622 and 626 may be adversely affected.

In the voltage and current revenue class metering modules 622 and 626 the phase shift may become an issue when there are different amounts of phase shift between the current signals or voltage signals processed through the voltage and current transducers 618 and 620, the voltage and current amplifiers 630 and 634 and/or the voltage and current filters 612 and 614. When a different phase shift is present, the voltage and current revenue class metering modules 622 and 626 may include digital phase compensation to maintain and/or regain substantially similar phasing among the filtered signals. In one example, the voltage and current revenue class metering modules 622 and 626 may include a predetermined propagation delay value for each of the voltage and current filters 612 and 614. Thus, filtered signals received from a respective filter with a lesser phase shift may be further delayed with the voltage and current revenue class metering modules 622 and 626 to make the magnitude of the phase shift substantially similar to the one of the voltage or current filters 612 or 614 with the greatest phase shift. Digital phase compensation may be implemented in the voltage and current revenue class metering modules 622 and 626 with a filter, such as a digital filter.

Figure 9:
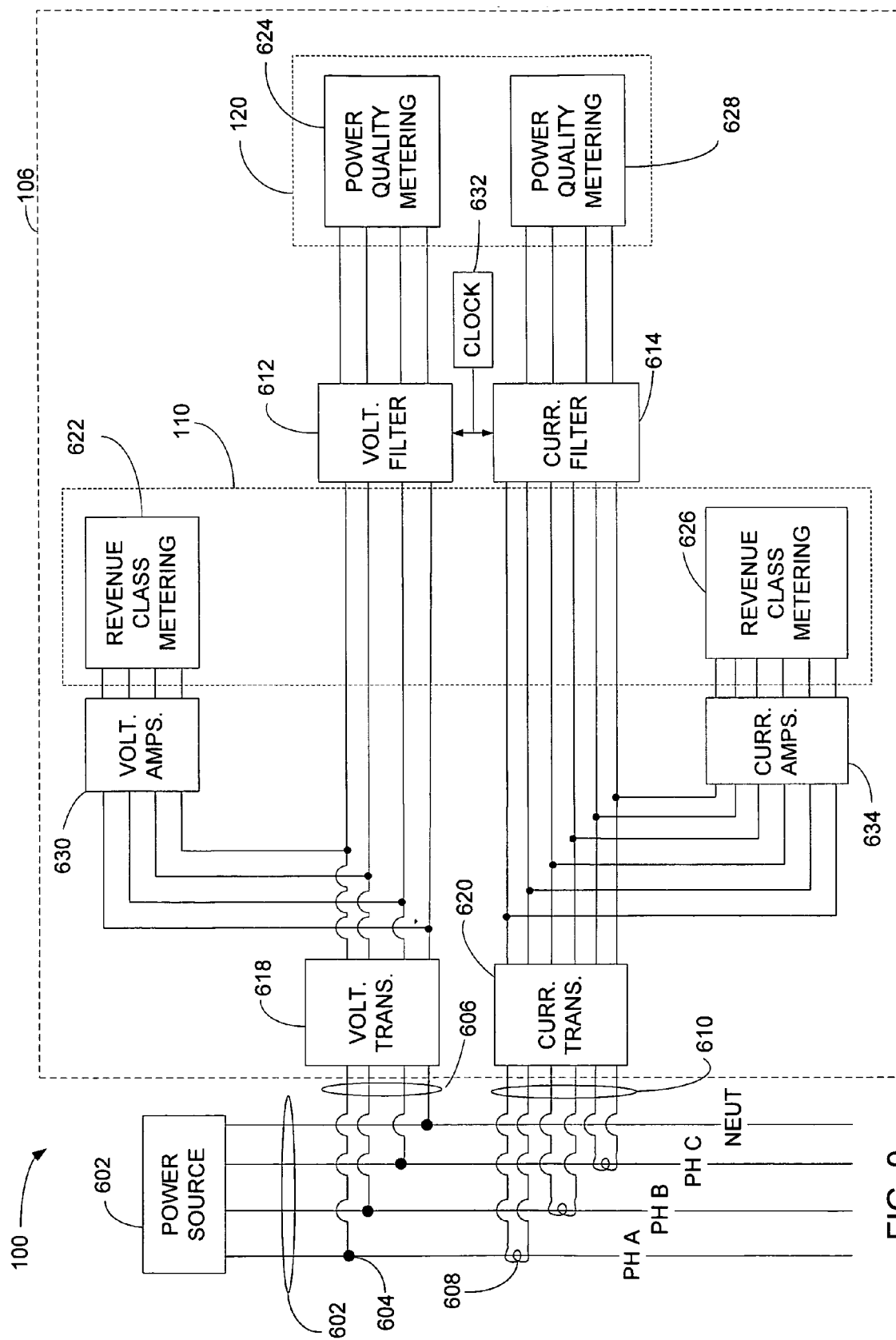
FIG. 9 is a block diagram of another example power system that includes a power meter.

FIG. 9 is a block diagram of a portion of the power system 100 that includes the power source 600, conductors 602, and another example of the power meter 106. As with the power system of FIG. 6, the revenue class metering module 110 and the power quality metering module 120 may be coupled with the voltage and current transducers 618 and 620 and/or the voltage and current sensors 604 and 608. For purposes of brevity, only differences with the example power meter 106 described with reference to FIG. 6 will be discussed. In this example, the power meter 106 may be configured so that the voltage and current revenue class metering modules 622 and 626 receive measured voltage and current signals from the outputs of the voltage transducers 618 and the current transducers 620, prior to the signals being filtered by the voltage and current filter 612 and 614. Accordingly, the voltage and current revenue class metering modules 622 and 626 and the voltage and current power quality modules 624 and 628 both use the same measured signals. However, the measured signals are filtered prior to receipt by the voltage and current power quality modules 624 and 628, but not by the voltage and current revenue class metering modules 622 and 626.

In FIG. 9, the voltage filter 612 and the voltage amplifier 630 are coupled in parallel with the voltage transducer 618. In other examples, the voltage filter 612 and the voltage amplifiers 630 may be configured to be coupled in parallel with the voltage sensors 604, and the voltage transducers 618 may be omitted. The current filter 614 and the current amplifiers 634 may be coupled in parallel with the current transducers 620 since the current signals are converted to a representative voltage.

The voltage amplifiers 630 may be coupled with the revenue class metering module 622. Alternatively, the revenue class metering module 622 may be directly coupled with the voltage transducers 618 and the voltage amplifiers 630 may be omitted. The current amplifiers 634 may be coupled with the revenue class metering module 626. Alternatively, the revenue class metering module 626 may be directly coupled with the current transducers 620 and the current amplifiers 634 may be omitted.

The voltage filter 612 may be coupled with the voltage power quality metering module 624. In another example, a voltage amplifier may be coupled between the voltage filter 612 and the voltage power quality metering module 624. The current filter 614 may be coupled with the current power quality metering module 628. In another example, a current amplifier may be coupled between the current filter 614 and the current power quality metering module 628.

Figure 10:
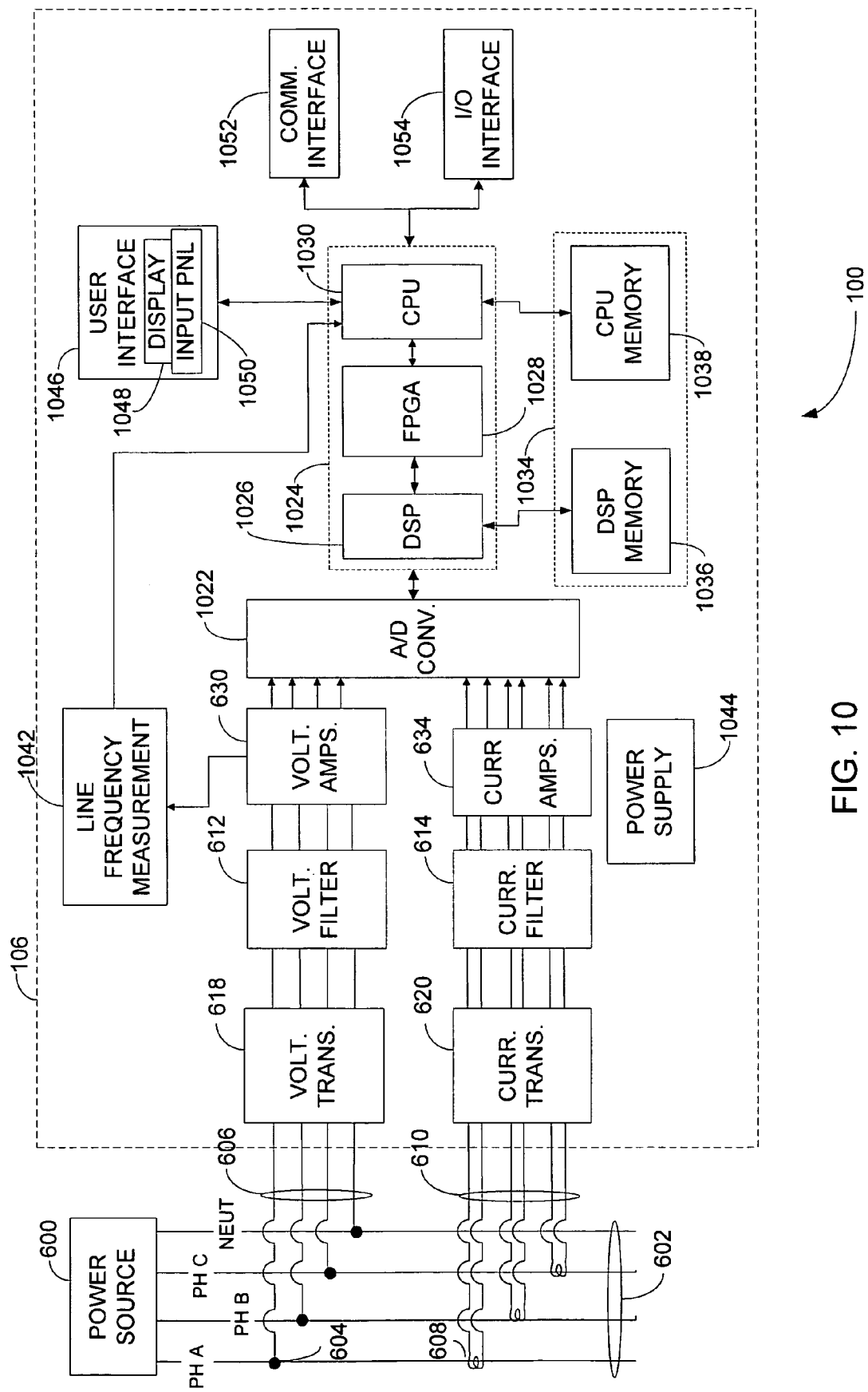
FIG. 10 is block diagram of another example power system that includes a power meter.

FIG. 10 is a more detailed example block diagram of the functionality of the power meter 106 depicted in FIG. 6. FIG. 10 includes the power source 600, conductors 602 and the power meter 106. The power meter 106 is coupled with the conductors 602 via the voltage sensors 604 and the voltage metering channels 606. The current sensor 608 may generate current signals on the current channels 610 to the power meter 106. Similar to FIG. 6, both the revenue class metering module and the power quality metering module may receive filtered measured voltage and current signals. Thus, measured voltage and measured current signals may be coupled with the voltage transducers 618 and the current transducers 620. The filtered voltage and current signals may be provided to the respective voltage amplifier 630 and the current amplifier 634.

In FIG. 10, the filtered and modified, or unmodified, voltage and current signals may be converted from analog to digital signals with an analog to digital converter 1022, and provided to a processor 1024. The processor 1024 may include a digital signal processor (DSP) 1026, a field programmable gate array (FPGA) 1028, and a central processing unit (CPU) 1030. In other examples, one or more, or any combination of the DSP 1026, the FPGA 1028 and the CPU 1030 may be used to form the processor 1024. The processor 1024 may direct the operation of the power meter 106. In addition, the processor 1024 may process the electrical parameters measured from the conductors 602. In one example, the common clock signal, discussed with reference to FIG. 6, may be generated by the FPGA 1088. A memory 1034 may include a DSP memory 1036 and a CPU memory 1038. The memory 1034 may include volatile and/or non-volatile memory. The memory 1034 may store instructions executable by the processor 1024. In addition the memory may store power parameters, both measured and calculated by the processor 1024, user profiles, passwords, configurations, and/or any other data related to the revenue meter and power quality functionality.

In another example, the voltage and current filtering may be implemented using a multiple filter stage approach. The voltage and current filters 612 and 614 may be configured as first order analog low pass filters, constructing a first stage of the multiple filter stage approach. The first stage filtered input signals may then be processed by the processor 1024. The first filter stage may have a passband in the million hertz range, or MHz range. The first filter stage may be configured with a large passband operative to provide anti-aliasing for the analog to digital converter (ADC) 1022. The first stage anti-aliasing filter allows for the use of a high-speed ADC to be used.

In the above example the ADC 1022 may be configured to output samples in the order of at least one million samples per second, or alternatively known as mega-samples per second (MSPS). The requirement for the ADC 1022 to have a sampling rate in the MPSP range comes from oversampling theory. Generally speaking, a 4 time oversampling factor gives 1-bit of additional resolution for an ADC, represented by $4^N$, where N is the desired number of additional resolution bits. If, for example, 16-bits of desired resolution are required for an application, but a 12-bit ADC is being used, then there will need to be a $4^4$ time oversampling of the input signal to achieve the additional 4-bits of resolution. This oversampling in combination with Nyquist's sampling theory, signal must be sampled at a frequency twice that of the signal frequency, leads to sampling at a rate in the range of MSPS. One example of this would be a measurement of an input signal with a frequency of 20 kHz, a sampling frequency for the ADC 1022 would be about 5.12 MHz=(2*20 kHz)*($4^4$ times oversampling).

Further, the processor 1024 may be configured as a digital filter, constructing a second stage of the multiple filter stage approach. Within the processor 1024, the FPGA 1088 may be configured to perform the second stage digital filtering on the data produced from the ADC 1022. The second stage digital filter is configured with a much narrower passband then the first filter stage. The narrow passband of the second filter stage, compared to that of the first stage, exposes only the signals of the desired measurement range for the revenue class power meter 106.

Wherein, the digital filters configured in the FPGA 1088, may be configured to have multiple corner frequencies allowing for multiple passbands. The multiple passbands operative to supply data for revenue metering modules and/or for power quality modules already discussed. Where the passbands for the power quality module and revenue metering modules may be in the range of the desired measurement. For example, some power quality standards, such as IEC 61000-4-7, state that measurements for up to the 50$^{th}$ harmonic are required. In the case of a 60 Hz power system a first passband for the power quality module may be set from about 0 Hz to about 1 kHz above the 50$^{th}$ harmonic, which would be 1 kHz+3 kHz. In an example of a second passband, the revenue metering module may require more of the input signal information than up to the 50$^{th}$ harmonic. In this case a second passband may be extended out from about 0 Hz to about 20 kHz. The first and second passbands are not limited to the above examples as there are many applications and/or standards that may require different passbands.

Figure 11:
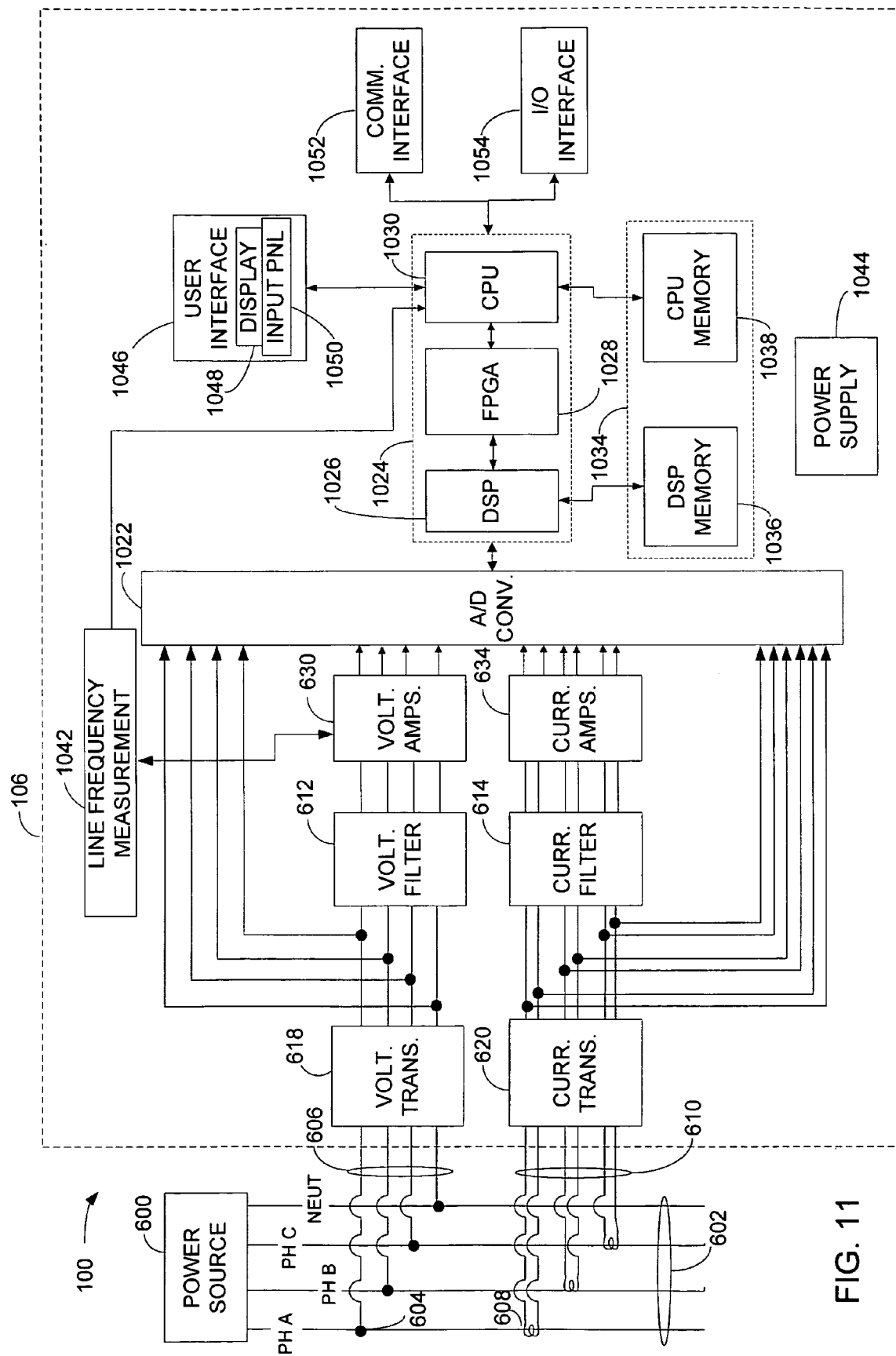
FIG. 11 is block diagram of another example power system that includes a power meter.

FIG. 11 is a more detailed example block diagram of the functionality of the power meter 106 depicted in FIG. 9. Similar to FIG. 9, the revenue class metering module is coupled with the voltage and current sensors 602 and 608, and may receive unfiltered measured voltage and current signals, and the power quality metering module is coupled with the voltage and current sensors 602 and 608, and may receive filtered measured voltage and current signals. The voltage sensors 602 and the current sensors 608 may be coupled with the voltage transducers 618 and the current transducers 620. For purposes of brevity, the remainder of the discussion regarding FIG. 10 will focus on differences with the example power meter 106 described with reference to FIG. 9.

The voltage and current transducers 618 and 620 may be coupled with the respective voltage and current filters 612 and 614. In addition, the voltage and current transducers 618 and 620 may be coupled with the A/D converter 1022. Thus, the converted, or not, voltage and current signals may be provided to the voltage and current filters 612 and 618 that are coupled in parallel with the A/D converter 1022. In another example, there may voltage and current amplifiers 630 and 634 coupled between the respective voltage and current transducers 618 and 620 and the A/D converter 1022. The filtered voltage and current signals may be provided to the respective voltage amplifier 630 and the current amplifier 634, which are coupled with the respective voltage and current filters 612 and 614. Alternatively, the filtered voltage and current signals may be provided directly to the A/D converter 1022, and the voltage and current amplifiers 630 and 634 may be omitted.

In FIG. 11, the filtered and modified, or unmodified, voltage and current signals may be converted from analog to digital signals with the analog to digital converter 1022, and provided to the processor 1024. In addition, the unfiltered and modified, or unmodified, voltage and current signals may be converted from analog to digital signals with the analog to digital converter 1022, and provided to the processor 1024. The analog to digital convert 1022 may receive voltage and current signals from the voltage transducers and/or the current transducers 618 and/or 620, and from the voltage amplifiers and/or the current amplifiers, 630 and/or the 634. Upon receiving the filtered and unfiltered voltage and current signals, the processor 1024 may execute the power quality metering module to process the filtered signals, and the revenue class metering module to process the unfiltered signals.

Since the voltage and current signals are received by the revenue class metering module without being filtered, the phasing of the voltage and current signals are unaffected by voltage and current filters 612 and 614. In addition, since processing accuracy with the power quality metering module may be unaffected by differential phase shifts of the voltage and current filters 612 and 614, the signal propagation delay (phase shift) of each of the voltage and current filters 612 and 614 may be different. In other example configurations, the power meter 106 may include a first set of voltage and current revenue filters to supply filtered signals to the revenue class metering module 110, and a second set of voltage and current power quality filters to supply filtered signals to the power quality metering module. In this example, the phase shift within the voltage and current revenue filters may be continuous, non-linear and substantially similar, while the phase shift of the voltage and current power quality metering may be different.

In FIGS. 10 and 11, the power meter 106 may also include a line frequency measurement module 1042, a power supply 1044 and a user interface 1046. The line frequency measurement module 1042 may be coupled with the voltage amplifier 630 and the processor 1024. Based on the filtered and modified voltage signal, the line frequency measurement module 1042 may generate a line frequency signal representative of the voltage present in the conductors 602. The line frequency signal may be provided to the processor 1024. The power supply 1044 may be powered by the conductors 602, an auxiliary supply of power, and/or a back up supply of power. The power supply 1044 may produce one or more voltages to power the power meter 106. In addition, the power supply 1044 may supply power to the metering options module 314. The user interface 1046 may include a display 1048 and an input panel 1050. In other examples, the user interface 1046 may include any other device and/or mechanism that provides a man machine interface to the power meter 106 and/or other devices in communication with the power meter 106.

The power meter 106 may also include a communication interface 1052. The communication interface 1052 may be similar to the previously described communication interfaces. Accordingly, a network, the removable metering options module, or any other device capable of peer-to-peer communications may be coupled with the communication interface of the power meter 106.

The input/output (I/O) interface 1054 may provide the capability to transmit and receive inputs and/or outputs with the power meter 106. The I/O interface 1054 may include digital, analog and/or serial communication capabilities. The power meter 106 may also include a power supply backup functionality. For example, the power meter 106 may include a battery or other energy storage device that is a backup power supply. The backup power supply may be configured to supply power to the power meter 106. In addition, the backup power supply may be configured to supply power to devices external to the power meter 106. In the event of loss of power to the power meter 106, the backup power supply may be automatically activated, switched, or otherwise enabled to provide a supply of power to the power meter 106. The backup power supply may power the entire power meter 106 when enabled to supply power.

Alternatively, the backup power supply may power only some of the functionality of the power meter 106. For example, the backup power supply may provide power to only the processor 1024 to allow communication of a loss of power alarm, or to only that portion of the metering circuitry that will enable continued collection and storage of measured data. Any form of partial powering scheme that prolongs the life of the energy storage device included in the backup power supply may be employed to maintain a desired functionality of the power meter 106 upon loss of the main power source.

Alternatively, or in addition, the backup power supply may include monitoring capability of the energy storage device included with the backup power supply. The power meter 106 may include the capability to sequentially power down predetermined and/or pre-selected functionality within the power meter 106 at predetermined stages, or thresholds, of depletion of the energy storage device.

The previously describe revenue class power meter is operable to provide both revenue accurate power consumption information and power quality information in a single meter using the same source information. The source information may be filtered by filters included in the power meter prior to being received by the revenue class metering module and the power quality metering module. During filtering, the source information, in the form of measure voltage and current signals may be low pass filtered to remove undesirable high frequency signal components. In addition, each of the filters may phase shift the measured voltage and current signals by substantially the same amount to maintain the phase of each of the measured voltage and current signals with respect to each other. Thus, both the revenue class metering module and the power metering module may accurately measure, derive and record power parameters in compliance with respective industry standards and accuracy requirements.

The previous description and illustrations are by way of example only. Many more embodiments and implementations are possible within the scope of this invention and will be apparent to those of ordinary skill in the art. The various embodiments are not limited to the described environments, and can be applied to a wide variety of activities. Accordingly, it is intended in the appended claims to cover all such changes and modifications which fall within the true spirit and scope of the invention. Therefore, the invention is not limited to the specific details, representative embodiments, and illustrated examples in this description. Thus, the invention is not to be restricted except as necessitated by the accompanying claims and their equivalents.

We claim:

1. A revenue class power meter comprising;
   a plurality of sensors configured to be coupled with a plurality of corresponding power conductors, wherein each of the sensors are operative to sense a power parameter of electrical energy present in the corresponding power conductors and generate respective input signals representative of a respective sensed power parameter;
   a plurality of transducers coupled with the respective sensors, the transducers operative to generate a voltage representation of the respective sensed power parameter;
   a plurality of filters coupled with the respective transducers, the filters operative to attenuate high frequency signal components about 1 kHz greater than the highest frequency desired to be measured, wherein each of the filters are configured to provide a predetermined signal propagation delay, signal gain and corner frequency that are substantially the same for all of the filters;
   a revenue class metering module configured to receive the input signals, wherein the revenue class metering module is operative to generate revenue accurate power consumption information based on the received input signals; and
   a power quality metering module coupled with the filters and configured to receive the filtered input signals, wherein the power quality metering module is operative to generate power quality information based on the received filtered input signals.

2. The revenue class power meter of claim 1, wherein the revenue class metering module is configured to receive the input signals that have been filtered with the filters.

3. The revenue class power meter of claim 1, wherein the revenue class metering module is configured to receive the input signals prior to the input signals being filtered with the filters.

4. The revenue class power meter of claim 1, wherein each of the filters are analog filters that comprise an integrated filter circuit, and are operative to reject the high frequency signals on said input signals.

5. The revenue class power meter of claim 4, wherein the integrated filter circuit is a switched capacitor integrated circuit filter.

6. The revenue class power meter of claim 4, wherein the integrated filter circuit is a continuous time integrated circuit filter.

7. The revenue class power meter of claim 1, wherein the filters are each configured to have substantially the same predetermined signal propagation delay, and are operative to substantially equally shift the phase of the input signals filtered by each of the respective filters.

8. The revenue class power meter of claim 7, further comprising a common clock, wherein the signal propagation delay, signal gain and corner frequency for all the filters is operative in accordance with a common clock signal generated with the common clock.

9. The revenue class power meter of claim 8, wherein the common clock signal is a digital signal generated with an integrated circuit.

10. The revenue class power meter of claim 8, wherein the common clock signal is an analog signal generated with passive components.

11. The revenue class power meter of claim 8, wherein the common clock signal is an analog signal generated with a crystal oscillator.

12. The revenue class power meter of claim 1, further comprising a processor and memory with instructions stored therein, the instructions executable by the processor to adjust a phase of the filtered input signal based on a predetermined signal propagation delay of the filter.

13. The revenue class power meter of claim 1, wherein each of the filters includes a digital filter that comprises a processor and memory with instructions stored therein, the instructions executable by the processor to reject high frequency noise in a frequency domain.

14. The revenue class power meter of claim 1, wherein the input signals are representative of one of voltage or current present on the power conductor.

15. The revenue class power meter of claim 1, wherein the revenue class meter includes an external master reset button operable to delete stored power parameter data and revenue accurate power consumption information.

16. The revenue class power meter of claim 15, wherein the master reset button is configurable as a tamper proof button.

17. The revenue class power meter of claim 1, wherein the revenue class meter includes an external test mode button operable to toggle the revenue class power meter between an operational mode and a test mode.

18. The revenue class power meter of claim 1, wherein the revenue class power meter includes at least one infrared communication port operable to transmit and receive data.

19. The revenue class power meter of claim 18, wherein the at least one infrared communication port includes a magnetic optical communications coupler.

20. The revenue class power meter of claim 18, wherein the at least one infrared communication port is operable with a communication protocol that conforms with International Electrotechnical Commission standard number 61107.

21. The revenue class power meter of claim 18, wherein the at least one infrared communication port is operable with a communication protocol that conforms with American National Standards Institute standard number C.12.18.

22. A revenue class power meter comprising:
a circuit operative as an analog filter stage to filter an input signal, the input signal representative of a measurable power parameter presentable on a power conductor;
a processor coupled with the circuit;
a memory coupled with the processor, wherein the memory comprises a plurality of instructions, the processor operative to execute instructions to form a digital filter stage to digitally filter the input signal;
wherein the digital filter stage in combination with the analog filter stage are operative as a multi-stage low pass filter to reject high frequency signal components included in the input signal;
a revenue class metering module configured to also receive the input signal, wherein the revenue class metering module is operative to generate revenue accurate power consumption information based on the input signal; and
a power quality metering module configured to receive the input signal, wherein the power quality metering module is operative to generate power quality information based on the received input signal.

23. The revenue class power meter of claim 22, wherein the analog filter stage comprises a continuous time integrated circuit filter.

24. The revenue class power meter of claim 22, wherein the analog filter stage comprises a switched capacitor integrated circuit filter.

25. The revenue class power meter of claim 22, wherein the analog filter stage comprises a discrete component continuous time filter.

26. The revenue class power meter of claim 22, wherein the analog filter stage is operative as an anti-aliasing filter.

27. The revenue class power meter of claim 22, wherein the revenue class metering module is configured to receive the input signal prior to being filtered, and the power quality metering module is configured to receive the filtered input signal.

28. The revenue class power meter of claim 22, wherein the revenue class metering module and the power quality metering module are configured to both receive the filtered input signal.

29. The revenue class power meter of claim 22, further comprising an analog to digital converter operative to sample the input signal at greater than one million samples per second to generate a digital representation of the input signal that has been filtered by the analog filter stage, the digital representation operative to be filtered by the digital filter stage.

30. The revenue class power meter of claim 22, wherein the digital filter stage is configured with a plurality of passbands, to pass at least two determined frequency ranges of the input signal.

31. The revenue class power meter of claim 30, wherein the revenue class metering module is configured to receive a first filtered input signal from a first passband and the power quality metering module is configured to receive a second filtered input signal from a second passband.

32. The revenue class power meter of claim 22, wherein the digital filter stage in combination with the analog filter stage are operative to reject high frequency signal components that are about 1 kHz greater than the highest frequency to be measured.

33. The revenue class power meter of claim 22, wherein the digital filter stage is configured to attenuate frequencies about 1 kHz greater than the highest frequency to be measured that were not attenuated by the analog filter stage.

34. The revenue class power meter of claim 22, wherein the revenue class metering module is configured to adjust a phase of the filtered input signal based on a signal propagation delay of the analog filter stage and the digital filter stage.

35. The revenue class power meter of claim 22, wherein the digital filter stage is operative as an anti-aliasing filter.

36. The revenue class power meter of claim 22, wherein the revenue class power meter is a rack mounted meter.

37. The revenue class power meter of claim 36, wherein the revenue class power meter comprises a removable options module configured to provide additional power quality related functionality.

38. A method of filtering in a revenue class power meter, the method comprising:
providing a first input signal on a first channel and a second input signal on a second channel;
filtering the first input signal with a first filter included in the first channel and filtering the second input signal with a second filter included in the second channel;
maintaining a non-linear constant phase shift of the filtered first input signal and a non-linear constant phase shift of the filtered second input signal to be about the same;
generating a revenue quality power consumption measurement with a revenue class metering module based on the first input signal and the second input signal; and
generating power quality information with a power quality metering module based on the first filtered input signal and the second filtered input signal.

39. The method of claim 38, wherein maintaining a non-linear constant phase shift further comprises during filtering, maintaining a signal propagation delay between the first filtered input signal and the second filtered input signal as substantially equal so that a non-linear phase shift of the first input signal and the second input signal will be about the same.

40. The method of claim 39, wherein maintaining a non-linear constant phase shift further comprises setting a corner frequency and a gain of the first filter and the second filter to be substantially equal so that a non-linear phase shift of the first input signal and the second input signal will be about the same.

41. The method of claim 39, wherein the step of filtering further comprises filtering with a first analog filter and a second analog filter in the time domain and the step of maintaining a signal propagation delay further comprises matching operational performance of a plurality of electrical components included in the first filter with operational performance of a plurality of electrical components included in the second filter.

42. The method of claim 38, wherein the step of achieving a non-linear phase shift further comprises, after filtering, digitally compensating the phase of at least one of the first filtered signal and the second filtered signal to make a magnitude of the phase shift of the first filtered signal about the same as a magnitude of the phase shift of the second filtered signal.

43. The method of claim 38, wherein the step of generating a revenue quality power consumption measurement comprises processing the filtered first input signal and the filtered second input signal with the revenue class metering module.

44. The method of claim 38, wherein the step of generating a revenue quality power consumption measurement comprises processing the first input signal that is unfiltered and the second input signal that is unfiltered with the revenue class metering module.

45. The method of claim 38, wherein the step of filtering comprising attenuating a high frequency signal component included in the first input signal and the second input signal that is greater than about 3 kHz.

* * * * *